United States Patent
Javerliac et al.

(10) Patent No.: US 8,344,758 B2
(45) Date of Patent: Jan. 1, 2013

(54) MAGNETIC DEVICE FOR PERFORMING A LOGIC FUNCTION

(75) Inventors: Virgile Javerliac, St. Prim (FR); Guillaume Prenat, Grenoble (FR)

(73) Assignees: Commissariat á l'énergie atomique et aux energies alternatives, Paris (FR); Centre national de la recherche scientifique, Paris (FR)

( * ) Notice: Subject to any disclaimer, the term of this patent is extended or adjusted under 35 U.S.C. 154(b) by 0 days.

(21) Appl. No.: 12/988,276

(22) PCT Filed: Apr. 15, 2009

(86) PCT No.: PCT/FR2009/050691
§ 371 (c)(1),
(2), (4) Date: Jan. 26, 2011

(87) PCT Pub. No.: WO2009/138616
PCT Pub. Date: Nov. 19, 2009

(65) Prior Publication Data
US 2011/0115522 A1    May 19, 2011

(30) Foreign Application Priority Data
Apr. 16, 2008    (FR) .................................... 08 52573

(51) Int. Cl.
*H03K 19/20* (2006.01)
(52) U.S. Cl. ........................ 326/104; 326/101
(58) Field of Classification Search .............. 326/37–41, 326/101, 104
See application file for complete search history.

(56) References Cited

U.S. PATENT DOCUMENTS

| 6,272,036 | B1 * | 8/2001 | You et al. ......................... 365/97 |
| 7,009,875 | B2 * | 3/2006 | Johnson .......................... 365/158 |
| 2004/0213042 | A1 | 10/2004 | Johnson .......................... 365/158 |

FOREIGN PATENT DOCUMENTS

| DE | 100 53 206 C1 | 1/2002 |
| WO | WO 2004/051853 | 6/2004 |

OTHER PUBLICATIONS

Internatinal Search Report as issued for PCT/FR2009/050691, dated Oct. 6, 2009.

Richter et al.; "Nonvolatile field programmable spin-logic for reconfigurable computing", Applied Physics Letters, AIP, American Institute of Physics, Melville, NY, vol. 80, No. 7, Feb. 18, 2002.

* cited by examiner

*Primary Examiner* — Don Le
(74) *Attorney, Agent, or Firm* — Pillsbury Winthrop Shaw Pittman, LLP

(57) ABSTRACT

A device for performing a "logic function" consisting of a magnetic structure including at least a first magnetoresistive stack including a first ferromagnetic layer and a second ferromagnetic layer separated by a non-ferromagnetic interlayer and at least one first line of current situated in the vicinity of the first magnetoresistive stack and generating in the vicinity of the first stack a magnetic field when an electric current passes through it. The first line includes at least two current input points so that two currents can be added together in the first line, with the sum of the two currents being determined by the logic function.

23 Claims, 6 Drawing Sheets

MAGNETIC DEVICE FOR PERFORMING A LOGIC FUNCTION

CROSS-REFERENCE TO RELATED APPLICATIONS

This is the U.S. National Stage of PCT/FR2009/050691, filed Apr. 15, 2009, which in turn claims priority to French patent application Ser. No. 08/52573, filed Apr. 16, 2008, the entire contents of all applications are incorporated herein by reference in their entireties.

The present invention concerns a device for performing a logic function including at least one magneto-resistive stack comprising a first ferromagnetic layer and a second ferromagnetic layer separated by a non-ferromagnetic interlayer.

Spin electronics, also called spintronics, is a rapidly developing discipline which consists in using the spin of the electron as an additional degree of freedom compared with classic electronics on silicon which only uses its charge. In fact, the spin has a significant effect on the transportation properties of ferromagnetic materials. Numerous applications of spintronics, in particular memory or logical elements, use magneto-resistive stacks consisting of at least two ferromagnetic layers separated by one non-magnetic layer. The magnetization of one of the ferromagnetic layers is set in a fixed direction and acts as a reference layer whilst the magnetization of the other layer may be commuted relatively easily by the application of a magnetic moment by a magnetic field or a spin-polarized current.

These stacks may be Magnetic Tunnel Junctions [MTJ] where the separating layer is insulating, or structures known as spin-valves where the separating layer is metallic. In these structures, the electrical resistance varies according to the relative orientation of the magnetization of both ferromagnetic layers.

The magnetic tunnel junctions are nanostructures consisting of two ferromagnetic layers separated by one oxide layer. The magnetization of one of the ferromagnetic layers (called the Hard Layer [HL]) is fixed. The stability of this layer may be ensured by its shape or by exchange coupling with an Anti-Ferromagnetic [AFM] layer. The magnetization of the other layer (called the Soft Layer [SL]) can be modulated. The resistance of the stack then depends on the relative orientation of the two ferromagnetic layers: this is the effect of the Tunnel Magneto Resistance [TMR]. The change from a Parallel (P) magnetization to an Anti-Parallel (AP) magnetization will present hysteretic behavior and the value of the resistance will then code the information contained in the junction.

In ferromagnetic materials, there is magnetocrystalline anisotropy due to interaction between the magnetic moment and the crystalline network. The result is a direction called easy magnetization in which the magnetization naturally aligns itself in the absence of any outside solicitation. A shape anisotropy can be added to this crystalline anisotropy, this time depending on the shape of the junction: for example, if an oval shaped junction is used, the shape anisotropy tends to align the magnetization on the largest axis of the junction. If the easy magnetocrystalline magnetization axis is oriented in this same direction, the effects are added and substantial stability for the junction is obtained.

The giant tunnel junction magnetoresistance elements are elements of storage of a new type of non-volatile magnetic memory. Associated with addressing arrays, they constitute Magnetic Random Access Memory [MRAM]. The intrinsic non-volatility of the magnetic devices, allied to high integration density, very fast write speed and effective immunity to radiation should allow the qualities of all the kinds of existing electronic memory to be combined and their performance to be surpassed. In the context of a memory use, the crucial characteristics are integration density, speed and consumption in writing and reading.

Besides MRAM type memory, a wide scope for the application of these tunnel effect magnetoresistances is programmable logic. A programmable logic circuit is a circuit whose functionality may be programmed using a standard circuit. If this functionality can be modified several times, they are known as reprogrammable circuits. The re-programmable circuits that are currently the most used are the Field Programmable Gate Arrays [FPGA] that consist of basic programmable logic functions known as conversion tables (or Look Up Tables [LUT]) interconnected to form a complex logic function. In this type of circuit, the function of each LUT is coded by a code stored in memory. Thus, logic gates or other logical elements can be designed using tunnel junctions or spin valves. These elements benefit from the non-volatile character of the information processed in them, and from the possibility of re-programming the gate, that is, by changing its functionality (for example, converting an AND gate into a NO OR). The problems of programmable logic are therefore quite close to those for memory, with several slight differences, as follows:

The integration density is less critical than in the case of a memory (as the programmable logic memory elements only serve to store the functionality of the circuit and not a large amount of data);

The speed and writing consumption are also less critical, as the functionality of the circuit is then programmed once and the functioning of the circuit consists only of a series of read cycles (except in the case of dynamic reconfiguration in which the functionality of the circuit develops during the course of being used).

The third large family of logic circuits is non-reprogrammable logic circuits or Application Specific Integrate Circuits [ASIC]. In these circuits, the logic function is unchangeable and a circuit must be designed for each logic function. This approach has much greater performance in terms of integration, but it needs a special circuit to be created which is much more expensive than adopting a reprogrammable approach. In this, there is no memory aspect: the logic function is generally broken down into elementary logic functions (such as "and", "or" and "supplement") called "standard cells" and interconnected to form the desired logic function.

Whilst many studies have been carried out into the MRAM and FPGA, there has been much less work on non-reprogrammable magnetic logic. In fact, the non-volatility and immunity to radiation of the MTJs predisposes them to a memory type of use. Also, as these devices are passive, it is a priori not possible directly to connect two purely magnetic logic functions without their function deteriorating, apart from calling upon Complementary Metal Oxide Semiconductor [CMOS] components to regenerate the signal. So, a logic function is generally broken down into elementary logic functions.

In addition, in the case of the use of a memory type or FGPA, the logic signal is transferred from one technology to the other (magnetic to CMOS and vice-versa) only a few times; in other words, the relation between the number of magnetic components and the number of CMOS components is sufficiently large to make the approach viable. Conversely, if a complex function needs to be carried out using elementary logic functions, the logic signal must cross a significant number of basic logic cells, each time requiring a double change in technology, as the number of these changes rapidly becomes prohibitive. This can also be expressed by saying that the abovementioned relation between the number of magnetic components and the number of CMOS components may quickly become unacceptable and the advantage of using magnetic components becomes questionable.

In this context, the purpose of the present invention is to provide a device allowing non-reprogrammable logic functions to be performed using a magnetic structure and overcoming the abovementioned problems.

For this purpose, the invention proposes a device for carrying out a "logic function" consisting of a magnetic structure comprising:

At least a first magneto-resistive stack including a first ferromagnetic layer and a second ferromagnetic layer separated by a non-ferromagnetic interlayer, At least a first current line situated in the vicinity of the first magnetoresistive stack and creating in the vicinity of the first stack a magnetic field when it is crossed by an electric current, with the said device being characterized, for the said at least one stack, by the said first line including at least two current input points such that two currents are added in the said first line, with the sum of the said two currents being determined by the said logic function.

Logic function means a function having a minimum Boolean complexity threshold equivalent to at least one of the four functions "AND", "OR", "NO AND" or "NO OR". Consequently, whether a memory is written to or read is not considered a logic function with regard to the invention.

In addition, in accordance with practice, a magnetoresistive element that includes at least one hard ferromagnetic layer and one soft ferromagnetic layer separated by a non-ferromagnetic interlayer (metallic or insulating) is called a "magnetoresistive stack" or a "magnetic tunnel junction". This element will be described below using the term "magnetoresistive stack".

In such stacks, either of the ferromagnetic layers, or both of them, may themselves consist of several ferromagnetic and non-ferromagnetic layers designed so that the whole behaves as a single ferromagnetic layer with higher performance, forming what is called a synthetic magnetic layer. Below, the terms "magnetic layer" or "ferromagnetic layer" will be used.

Using the invention, a logic function is generated by using a field write-in magnetoresistive stack and by connecting the entries together (possibly linked to lines) carrying different current signals so as to produce the logic function through the sum of the currents (Kirchhoff Laws) and not directly by the sum of the magnetic fields (involving several write lines in the vicinity of the stack). In the invention, the device understands the entries (possibly related to lines) of currents grouped together in a single write line; this configuration is particularly useful where there are a lot of entries; in this way, having a lot of current lines around the same stack is avoided.

It will be noted that the current lines may have various wire or tape shapes.

It will be noted that it is also possible to take lines of different widths so that, with an equal current and an equal distance from the ferromagnetic layer, the magnetic field generated by a wider line is less weak than the magnetic field generated by a line of lesser width.

In the invention, the device can also present one or more of the characteristics described below, considered individually or according to all the combinations that are technically possible, as follows:

The first line is connected to at least one other current line belonging to a level of metallization different from the metallization level of the first line, with both lines being connected by an interconnecting conducting line and the point of connection between the interconnecting line and the first line forming one of the two current input points;

The at least two current input points inject respectively a current $I_1$ and $I_2$ into the third line such that the intensity H' of the field generated by the third line in the vicinity of the soft layer is such that $$\frac{H'}{H} = \frac{I_1 + I_2}{I}$$

where H is the intensity of the magnetic field generated by the third current line to when it is crossed by a current I;

In the invention, the device contains:

At least a second magnetoresistive stack that may be either combined with the said first stack or different from the first stack, with the said second stack including a first ferromagnetic layer and a second ferromagnetic layer separated by a non-ferromagnetic interlayer, At least two lines of current belonging respectively to a first and a second level of metallization, with each of the said two lines generating a magnetic field in the vicinity of the said second stack where they are crossed by an electric current, with the said two lines being positioned at different distances from the said second ferromagnetic layer of the second stack; the distance between a line and the second layer is understood as the distance separating the centre of the second layer and the point of the line nearest to the centre of the second layer. The second layer will most often be a soft ferromagnetic layer whilst the first layer will most often be a hard ferromagnetic layer held in a fixed magnetic state used as the reference. It will be noted that the axes of symmetry of the lines of current in the direction of the current and the centre of the second layer are not necessarily in the same plane: in this case, this is known as spatial "offset". In a way analogous to semiconductor integrated circuits, the device according to this embodiment of the invention is produced using multiple interconnecting layers consisting of the alternation of conductor layers also called "metallization levels" provided with metalized conductor lines extending in parallel to the said layer and of insulating layers traversed by conductor vias allowing electrical connection between two metallization levels. A metallization layer consists of multiple conductor lines surrounded by areas produced in dielectric material. Playing upon the distance between the write line and the soft layer will allow the effect of a current compared with another current in another line to be assessed and allow a contribution to the generation of a logic function. In all known devices (memory type cells, for example) the distance of the line to the magnetoresistive stack is fixed and minimal for matters relating to current density. Conversely, according to this embodiment of the invention, the amplitude of the magnetic field will be modulated by taking an interconnection topology with different distances between the soft layer and the lines, with the sum of the effect of each line shown by the sum of the magnetic fields generated. The interconnection topology will therefore consist in judiciously placing the write lines around the magnetoresistive stack so as to apply the total magnetic field required to orient the magnetization of the soft layer compared with that of the hard layer such that the resulting tunnel resistance codifies the information required. This embodiment avoids problems of the interconnection of elementary logic functions by using the topology of the write lines (ad hoc choice of the direction of the lines compared with the magnetoresistive stacks, the direction of the current running across them and the distance between these lines and the stacks):

- The two lines are situated on either side of the second magnetoresistive stack;
- One of the two lines is situated at a distance d1 above the second layer and the other of the two lines is situated at a distance d2 below the second layer, such that, for two currents of the same intensity circulating respectively in either of the said two lines, the intensities H1 and H2 of the fields generated respectively by the line situated at distance d1 and by the line situated at distance d2 in the vicinity of the said second layer are such that:

$$\frac{H_1}{H_2} = \frac{d_2}{d_1};$$

In the invention, the device contains:
- At least one magnetoresistive stack including a first ferromagnetic layer and a second ferromagnetic layer separated by a non-ferromagnetic interlayer,
- At least two current lines belonging, respectively to a first and a second metallization level, with each of the two lines generating a magnetic field in the vicinity of the at least one stack where they are crossed by an electric current, the said two lines being positioned at an equal distance on either side of the said second ferromagnetic layer;
- The first ferromagnetic layer or layers are hard ferromagnetic layers pinned in a fixed magnetic state that are used as a reference and the second ferromagnetic layer or layers are soft ferromagnetic layers;
- The soft layer or layers present a circular or quasi-circular shape so as to minimize the write current required to modulate their magnetic orientation;
- The hard layer of each of the magnetoresistive stacks is pinned in a magnetic state perpendicular to an easy magnetization axis used as a reference for the soft layer of the same stack, with the soft layer of the magnetoresistive stack presenting a magnetic orientation that can be modulated by the current issuing from the line or lines of current situated in the vicinity of the magnetoresistive stack so as to induce a modification to the transversal resistance of the stack sufficient to set off an electric signal, with this modulation of the magnetic orientation of the soft layer of the stack being sufficiently weak for the orientation not to bounce between two stable positions but to fluctuate around one stable position.
- The device in the invention contains an input interface comprising:
  - At least one input receiving logic information codified in the form of a voltage level representing a logic '0' or a '1';
  - At least one output connected to an interconnection conductor line;
  - Electronic means of generating in the interconnection conductor line a current whose direction is representative of the logic information, with the absolute value of the intensity of the current being identical in one direction or in the other direction of the current;
- The device in the invention has an output electrically connected to the at least one first magnetoresistive stack, the interface containing:
  - One input linked to an interconnection conductor line electrically linking the input to the said at least one first magnetoresistive stack;
  - Means for measuring the current circulating in the said at least one first stack, a current representative of the magnetic state of the said at least first stack;
  - Means for generating voltage representative of the said magnetic state according to the said current;
- The device in the invention contains:
  - A second magnetoresistive stack including a first ferromagnetic layer and a second ferromagnetic layer separated by a non-ferromagnetic interlayer;
  - An output interface electrically linked to the said first and second magnetoresistive stacks, with the said interface consisting of:
    - A first input linked to an interconnection conductor line electrically linking the first input to the said first magnetoresistive stack;
    - A second input linked to an interconnection conductor line electrically linking the second input to the second magnetoresistive stack;
    - Means of generating a differential current between the current circulating in the said first stack and the current circulating in the second said stack where they are subject to bias voltage, the differential current being representative of logic information;
    - Means for generating voltage representative of the said logic information according to the said differential current;
- The said input and/or output interface is produced with CMOS technology;
- The said magnetic structure is situated above the said interface or interfaces produced using CMOS technology;
- The non-ferromagnetic junction interlayers are made of Magnesium Oxide MgO;
- The device in the invention consists of at least two lines of different widths situated in the vicinity of a magnetoresistive stack.

The purpose of the present invention is also a first adder incorporating a device in the invention, with the said adder consisting of:
- An input interface for signals of current $I_A$, $I_B$ and $I_{Cin}$ flowing through three interconnection lines,
- A magnetic structure consisting of:
  - A magnetic part for the generation of the said sum,
  - A magnetic part for the generation of the said carry, with the said magnetic part for the generation of the said carry consisting of:
- A first magnetoresistive stack including a hard ferromagnetic layer and a soft ferromagnetic layer separated by a non-ferromagnetic interlayer, with the hard ferromagnetic layer being pinned in a fixed magnetic state used as a reference,
- A second magnetoresistive stack including a hard ferromagnetic layer and a soft ferromagnetic layer separated by a non-ferromagnetic interlayer, with the hard ferromagnetic layer being pinned in a fixed magnetic state used as a reference,
- A first current line generating a magnetic field in the vicinity of the first and second stacks and being situated at a distance d following the vertical axis of the soft layers of each of the first and third stacks,
- A first and a second vertical conductive via electrically linking the first line of current respectively to a second current line run through by the current $I_A$ and to a branch of a third current line run through by the sum of the currents $I_B+I_{Cin}$ such that the currents $I_B+I_{Cin}$ and $I_A$ are added together before being routed on the first line of current generating a magnetic field in the vicinity of the first and second stacks.

Advantageously, the said magnetic part for the generation of the said sum includes:

A third magnetoresistive stack including a hard ferromagnetic layer and a soft ferromagnetic layer separated by a non-ferromagnetic interlayer, with the hard ferromagnetic layer being pinned in a fixed magnetic state used as a reference, A fourth magnetoresistive stack including a hard ferromagnetic layer and a soft ferromagnetic layer separated by a non-ferromagnetic interlayer, with the hard ferromagnetic layer being pinned in a fixed magnetic state used as a reference, A third and fourth current line, with the said second, third and fourth current lines belonging respectively to a first, a second and a third metallization level, A third, a fourth and a fifth vertical conductive via for access to the said input, interface connected electrically respectively to the said second, third and fourth current lines such that the said third vertical via injects the current $I_B$ into the said third line, the said fourth vertical via injects the current $I_A$ into the said second line and the said fifth vertical via injects the current $I_{Cin}$ into the said fourth current line, with the said second current line generating a magnetic field in the vicinity of the said third and fourth stacks and being situated at a distance d following the vertical axis of the soft layers of each of the said third and fourth stacks, with the said third current line generating a magnetic field in the vicinity of the said third stack and being situated at a distance 2×d following the vertical axis of the soft layer of the said third stack, with the said fourth current line generating a magnetic field in the vicinity of the said third and fourth stacks and being situated at a distance 2×d following the vertical axis of the soft layers of each of the said third and fourth stacks, with the said third current line being electrically linked to the said fourth current line through a vertical interconnection via such that the currents $I_B$ and $I_{Cin}$ of the said third and fourth lines are added before being routed on the branch of the said fourth current line generating a magnetic field in the vicinity of the said fourth stack, the said second current line being markedly perpendicular to the said third and fourth current lines in the vicinity of the said third stack and the said second current line being markedly perpendicular to the said fourth current line in the vicinity of the fourth stack.

The purpose of the present invention is also a second adder incorporating a device for the invention consisting of:

A signal input interface for the current $I_{A0}$, $I_{B0}$ and $I_{Cin0}$ flowing through three interconnection lines, A magnetic structure consisting of:
 a magnetic part for generating the said sum including:
  a first magnetoresistive stack including a hard ferromagnetic layer and a soft ferromagnetic layer separated by a non-ferromagnetic interlayer, with the hard ferromagnetic layer being pinned in a fixed magnetic state used as a reference,
  a second magnetoresistive stack including a hard ferromagnetic layer and a soft ferromagnetic layer separated by a non-ferromagnetic interlayer, with the hard ferromagnetic layer being pinned in a fixed magnetic state used as a reference,
  a first, a second and a third current line belonging respectively to a first, a second and a third metallization level,
  a first, a second and a third vertical conductive via for access to the said input interface respectively electrically connected to the said first, second and third current lines such that the first vertical via injects the current $I_B$ into the said first line, the said second vertical via injects the current $I_A$ into the said second line and the said third via injects the current $I_{Cin}$ into the said third line, with the said second current line generating a magnetic field in the vicinity of the said first and second stacks and being situated at a distance d following the vertical axis of the soft layers of each of the said first and second stacks, with the said first current line generating a magnetic field in the vicinity of the said first stack and being situated at a distance 2×d following the vertical axis of the soft layer of the said first stack, the said third current line generating a magnetic field in the vicinity of the said first and second stacks and being situated at a distance 2×d following the vertical axis of the soft layers of each of the said first and second stacks, the said first current line being electrically linked to the said third current line through a vertical interconnection via so that the currents $I_B$ and $I_{Cin}$ of the said first and third lines are added before being routed on the branch of the said third current line generating a magnetic field in the vicinity of the said second stack, the said second current line being markedly perpendicular to the said first and said third current lines in the vicinity of the said first stack and the said second current line being markedly perpendicular to the said third current line in the vicinity of the said second stack, a fourth current line, called the carry propagation line belonging to the said first metallization level,
 a fourth and a fifth vertical conductive via electrically linking the said fourth current line respectively to the said second current line through which travels the current $I_A$ and to the said branch of the said third current line through which travels the sum of the currents $I_B+I_{Cin}$ so that the currents $I_B+I_{Cin}$ and $I_A$ are added together before being routed on the said fourth current line,
 a fifth current line belonging to a metallization level different from the said first metallization level and able to produce a magnetic field in the vicinity of a magnetoresistive stack,
 a sixth vertical conductive via electrically linking the said fourth current line to the said fifth current line.

Advantageously, the second adder includes:
 a seventh vertical conductive via electrically linked to the said carry propagation line;
 a current limiter circuit to limit the absolute value of the current travelling through the said carry propagation line, the said current limiter circuit being linked to the said propagation line by the said seventh conductive via.

As a preference, the said limiter includes three PMOS transistors and three NMOS transistors mounted in series, with the first PMOS transistor and the third NMOS transistor having a common gate, the second PMOS transistor and the second NMOS transistor having a common gate, the third PMOS transistor and the first NMOS transistor having a common gate, the common drain of the first NMOS transistor and of the third PMOS transistor being connected to the said carry propagation line by the said seventh vertical conductive via.

The purpose of present invention is also an "and" logic gate incorporating a device in the invention, the said "and" gate consisting of:
- an input interface for signals of current $I_A$ and $I_B$,
- a magnetic structure consisting of:
  - a magnetoresistive stack including a hard ferromagnetic layer and a soft ferromagnetic layer separated by a non-ferromagnetic interlayer, with the hard ferromagnetic layer being pinned in a fixed magnetic state used as a reference,
  - a first, a second, a third and a fourth current line, The said first current line receiving the current $I_A$,
The said second current line receiving the current $I_B$,
The said third current line receiving a pre-determined constant current,
The said fourth current line situated in the vicinity of the said magnetoresistive stack and generating in the vicinity of the said stack a magnetic field when an electric current passes through it, the said the fourth current line having three current input points linking it electrically to the said first, second and third current lines such that the current circulating in the said first, second and third current lines are added together in the said fourth line.

Lastly, the purpose of the present invention is a majority voter device incorporating a device in the invention, the said majority voting circuit consisting of:
- an input interface for signals of current $I_a$, $I_b$ and $I_c$ flowing through three interconnection lines,
- a magnetic structure consisting of a magnetic part for generating the output from the said majority voter including:
  - a first magnetoresistive stack including a including a hard ferromagnetic layer and a soft ferromagnetic layer separated by a non-ferromagnetic interlayer, with the hard ferromagnetic layer being pinned in a fixed magnetic state used as a reference,
  - a second magnetoresistive stack including a hard ferromagnetic layer and a soft ferromagnetic layer separate by a non-ferromagnetic interlayer, with the hard ferromagnetic layer being pinned in a fixed magnetic state used as a reference,
  - a first current line generating a magnetic field in the vicinity of the said first and second stacks and being situated at a distance d following the vertical axis of the soft layers of each of the said first and third stacks,
  - a first and a second conductive via electrically linking the said first current line respectively to a second current line through which travels the current $I_a$ and to a branch of a third current line through which travels the sum of the currents $I_b+I_c$ such that the currents $I_b+I_c$ et $I_a$ are added together before being routed on the said first current line generating a magnetic field in the vicinity of the said first and second stacks.

Other characteristics and advantages of the invention will be clearly shown by the description given of these below as an indication only and not in any way restrictive, in reference to the figures attached, as follows:

FIG. 1 is a simplified schematic representation of the magnetic field generated by an infinitely long current line;

FIGS. 2(a) and 2(b) represent a magnetoresistive stack and a rectilinear conductor wire of infinite length;

Figure 5:
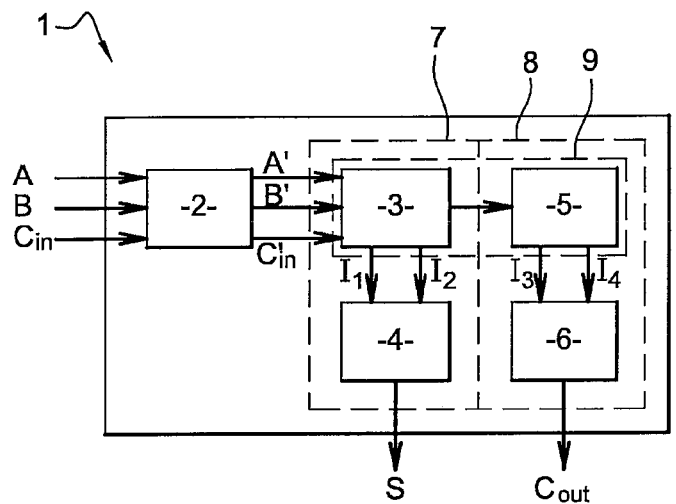
FIG. 5 illustrates the architecture of a device for performing a logic function of the adder type according to the invention.
Figure 6:
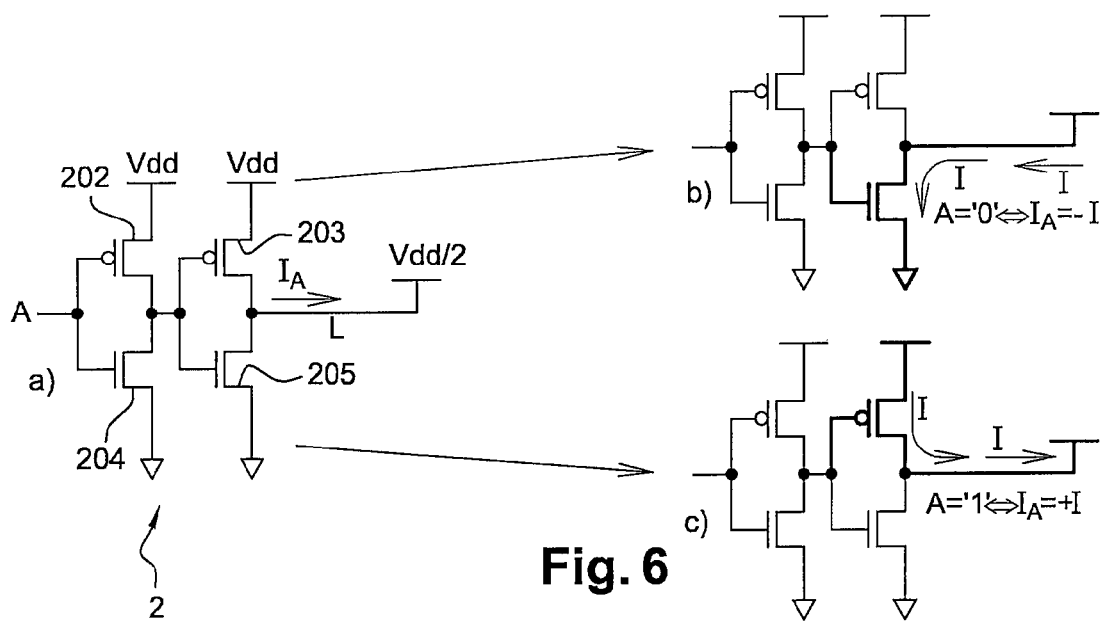
Figure 7:
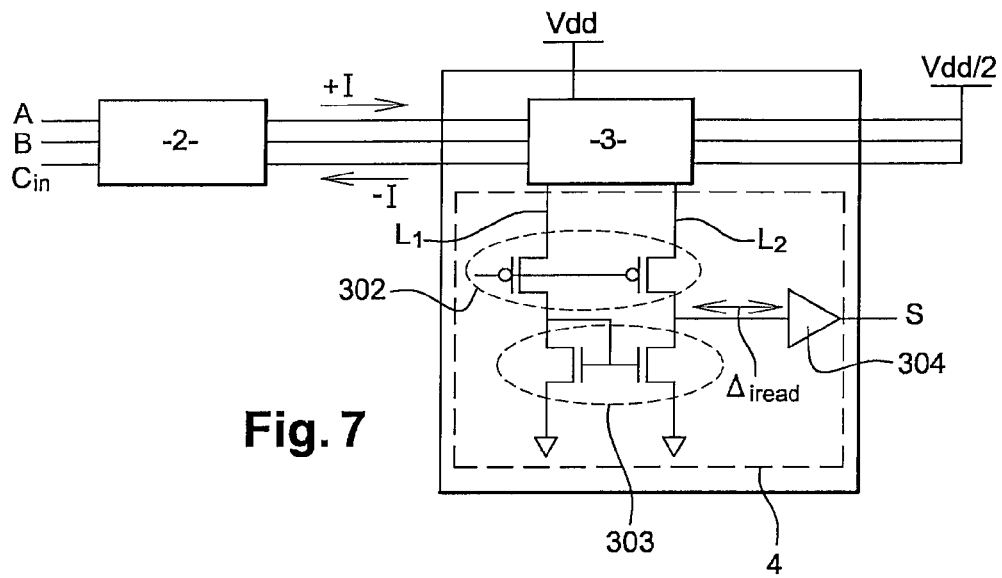
Figure 8:
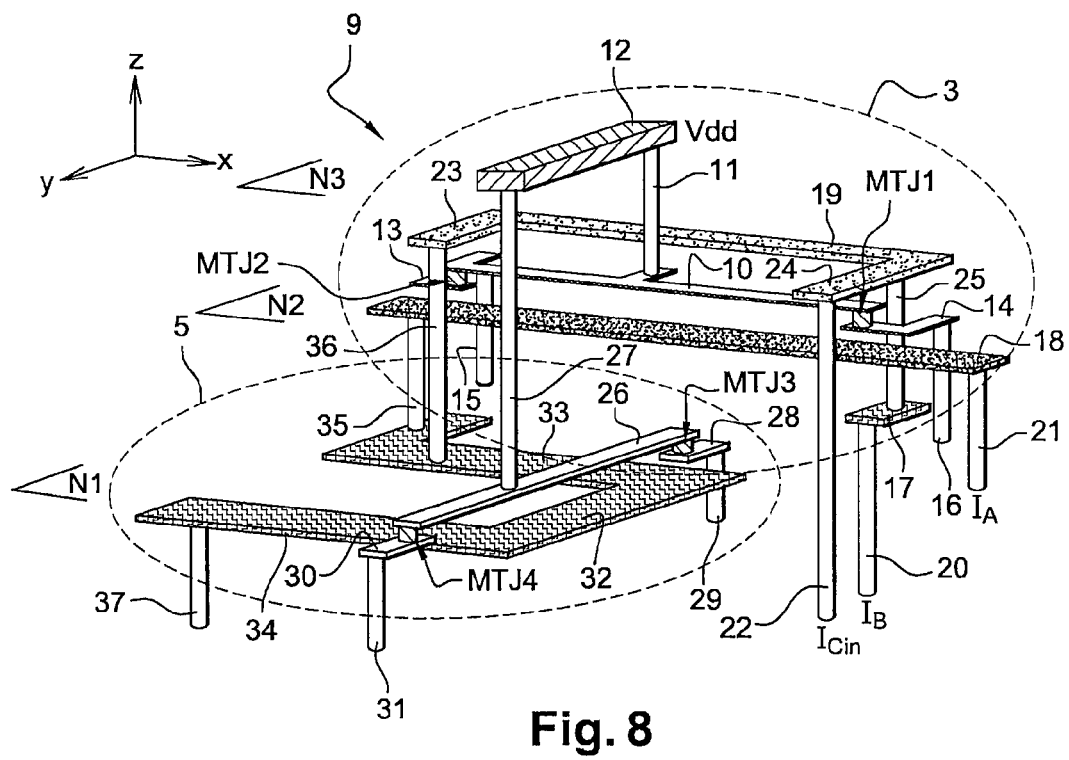
Figure 9:
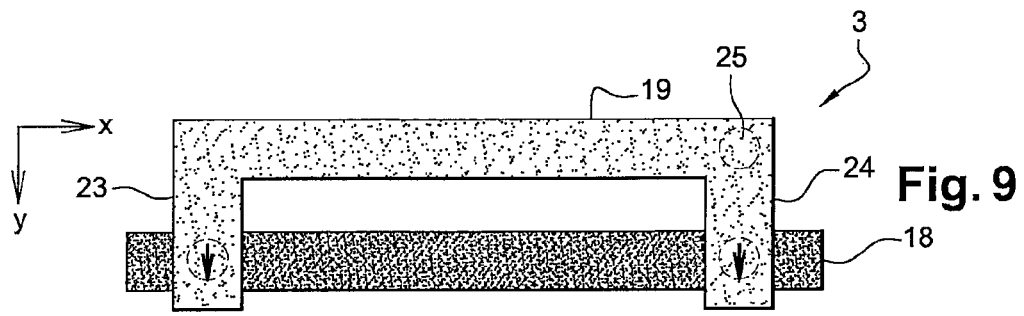
Figure 10:
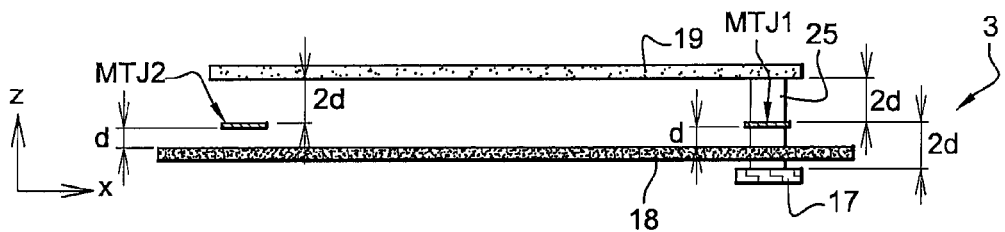
Figure 11:
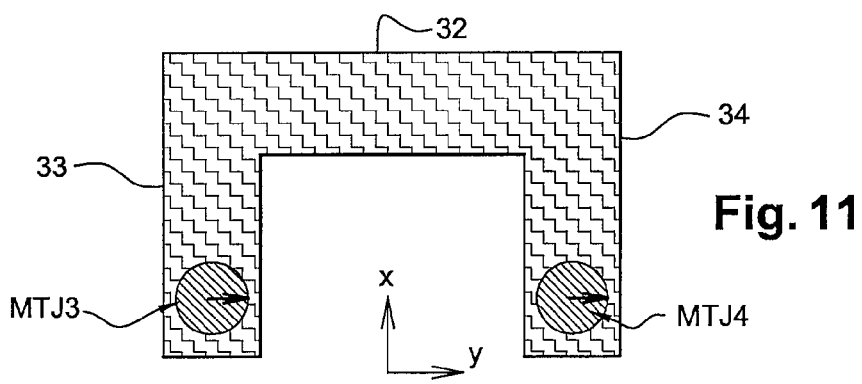
Figure 12:
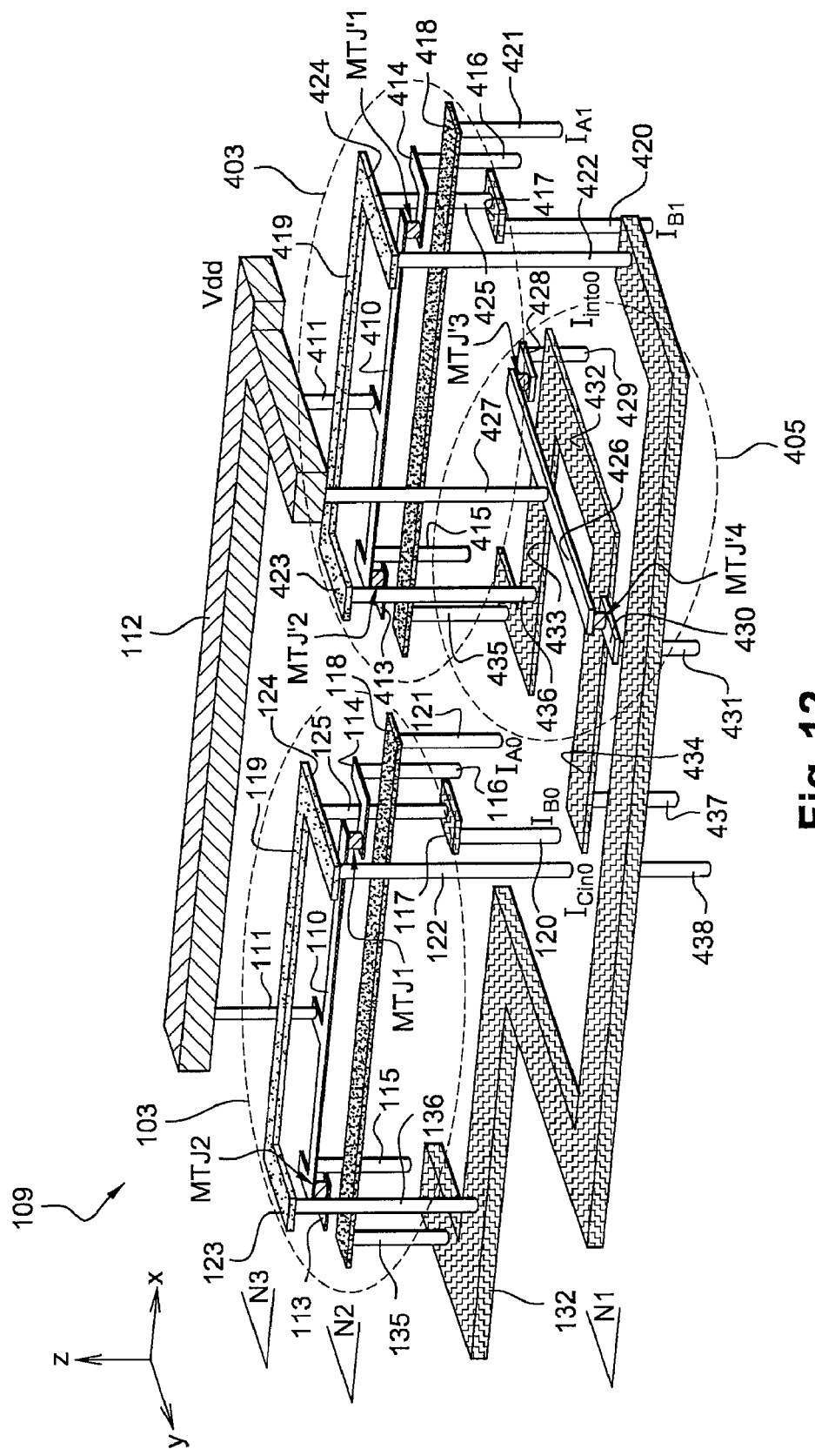
Figure 13:
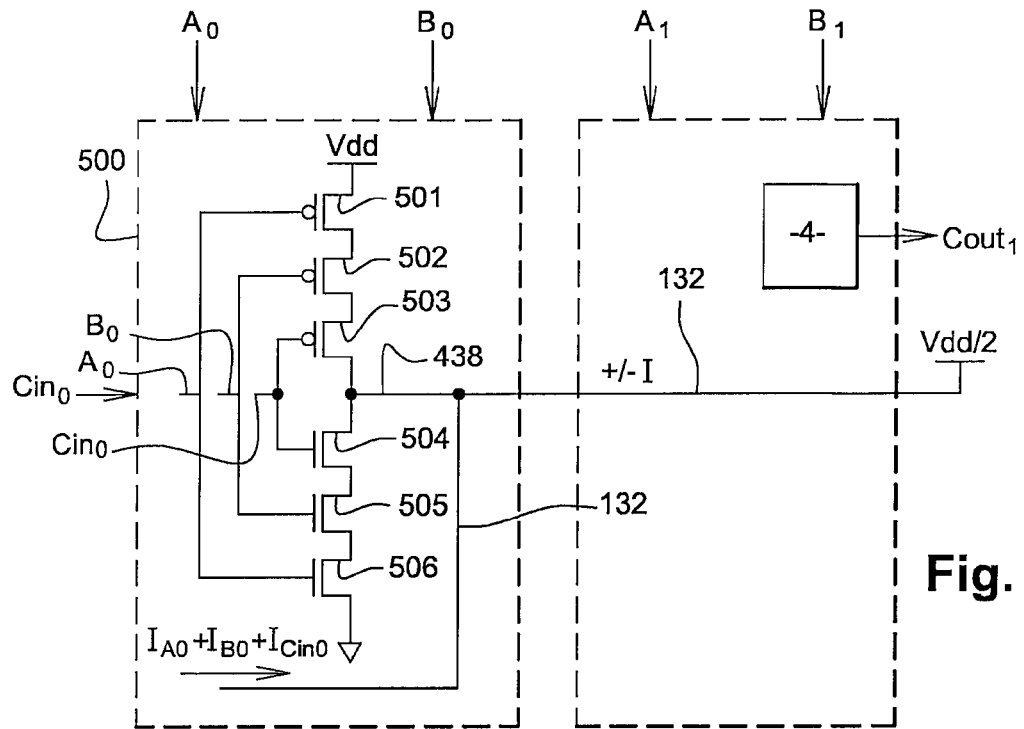
Figure 14:
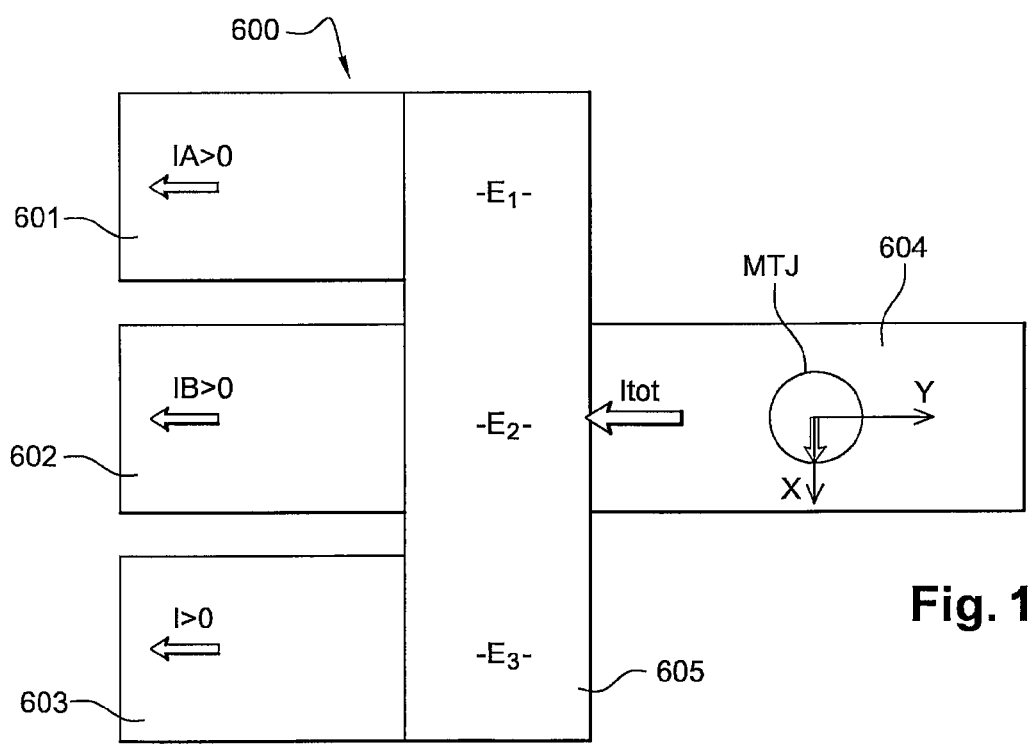

FIGS. 6 (a) to 6 b) illustrates an embodiment of an input interface of the device in FIG. 5;

FIG. 7 illustrates an embodiment of an output interface for the device in FIG. 5;

FIG. 8 represents a three-dimensional view of an embodiment of the magnetic parts for generating the sum and the carry for the device in FIG. 5;

FIGS. 9 and 10 represent respectively an above view and a frontal view of the magnetic part for generating a sum as shown in FIG. 8;

FIG. 11 represents an above view of the magnetic part for generating the carry as represented in FIG. 8;

FIG. 12 represents a three-dimensional view of a 2-bit adder according to the invention with carry propagation;

FIG. 13 represents a current limiter circuit used for the 2-bit adder in FIG. 12;

FIG. 14 schematically represents a device for producing a logic "and" gate according to the invention.

In all the figures, the common elements have the same reference numbers.

To illustrate the idea of topology interconnection, we will first quantify the magnetic field generated in a point in space by a distribution of current. That is, a local current density $\vec{j}$ in a point M' of the space located by its position vector $\vec{r}'$. The magnetic field generated by $\vec{j}$(F) in a point M located by its position vector $\vec{r}$ is given by the Biot and Savart Law, as follows:

$$d\vec{H}(\vec{r}) = \frac{\vec{j}(r^j) \times (\vec{r}-\vec{r}')}{4\pi|\vec{r}-\vec{r}'|^3}. \qquad (1)$$

It will be noted that the sign × designates the vector product.

The total magnetic field obtained for a distribution of the current densities V is obtained by integrating this equation into the whole of the volume V, as follows:

$$\vec{H}(\vec{r}) = \int\int\int_V \frac{\vec{j}(r^j) \times (\vec{r}-\vec{r}')}{4\pi|\vec{r}-\vec{r}'|^3} dV. \qquad (2)$$

Figure 1:
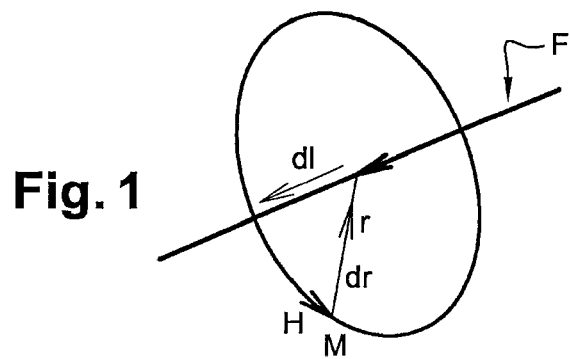

To simplify matters, in the following we shall consider the write line to be a wire of infinite length and we shall consider the case of a magnetic field generated by this wire of infinite length through which a current I travels. The circular section of the wire is of radius R. As illustrated in FIG. 1, the wire F passes at a distance r from a point M such that r>>R, where $\vec{dl}$ is a unit vector having the direction and course of the current and $\vec{dr}$ is a unit vector perpendicular to the current line and passing through M. In this precise case, the value of the field $\vec{H}$ in M is given by the following equation:

$$\vec{H} = \frac{I}{2\pi r} d\vec{r} \times d\vec{l}. \qquad (3)$$

It can already be seen that in this approximation, the value of the field depends on the direction, course and value of the current, as well as the distance of the line to the point considered.

Figure 2:
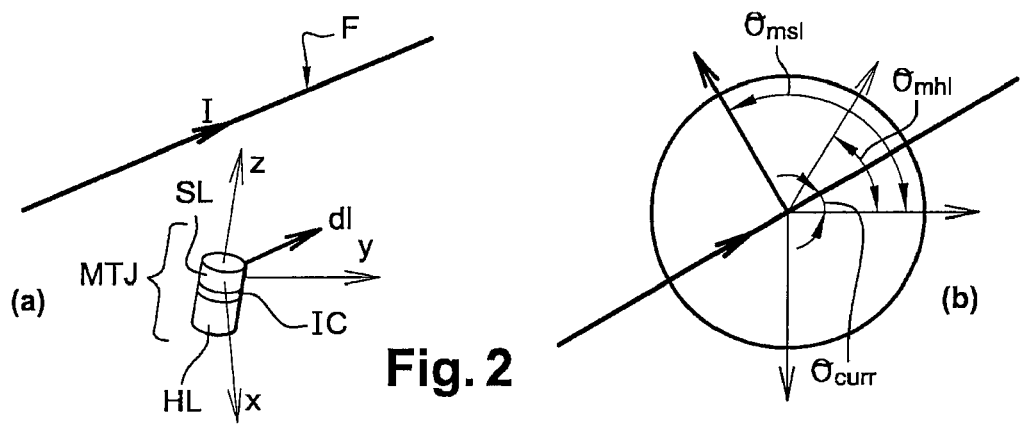

For example, we shall now consider that the point M represents the centre of the soft ferromagnetic layer (SL) of a Magnetic Tunnel Junction [MTJ] magnetoresistive stack as represented in FIG. 2(a) consisting in addition of a hard ferromagnetic layer (HL) and a non-ferromagnetic interlayer (IC) separating the SL and HL layers. The current line F always has a current I travelling through it. With the conventions of FIG. 2(b) where $\theta_{curr}$, $\theta_{msl}$ et $\theta_{mhl}$ are angles formed respectively by the current line F, the magnetization of the soft layer and the magnetization of the hard layer with the axis of easy magnetization of the soft layer (situated on the y axis of a location point xyz in which the x axis is perpendicular to the y axis in the sheet plan and z is perpendicular to the plane of the sheet). The magnetic field applied to the centre of the soft layer is given by the following equation:

$$\vec{H} = \frac{I}{2\pi r} d\vec{r} \times d\vec{l} = \frac{I}{2\pi r} \begin{pmatrix} -\cos\theta_{curr} \\ -\sin\theta_{curr} \\ 0 \end{pmatrix} \quad (4)$$

If it is considered that there is no shape anisotropy and that the magnetocrystalline anisotropy field is negligible compared with the field applied, it may be considered as a first approximation that the magnetic moment will be aligned with the field generated.

If the example is considered where the magnetization of the hard layer is perpendicular to the axis of easy magnetization (i.e. $\theta_{mhl}=90°$), it may then be easy to choose the direction of the currents to be applied in order to obtain the parallel (note P), anti-parallel states (note AP) or intermediary (note INT) states of the magnetoresistive stacks as illustrated in Table 1 below ($R_P$ designates the resistance of the MTJ magnetoresistive stack in its parallel state, $R_{AP}$ the resistance of the magnetoresistive stack in its anti-parallel state and $R_{INT}$ the resistance of the magnetoresistive stack in an intermediate state such as $R_{AP} > R_{INT} > R_P$).

TABLE 1

| $\theta_{curr}$ | $\theta_{msl}$ | State | Resistance of the magnetoresistive stack |
|---|---|---|---|
| 0 | 90° | Parallel | $R_P$ |
| 180° | 270° | Anti-parallel | $R_{AP}$ |
| 90° | 180° | Intermediate | $R_{INT}$ |

Let us now suppose that there are two current lines $L_1$ and $L_2$, found respectively at the distances $r_1$ and $r_2$ from the centre of the soft layer, a field whose value is given by the following equation will be generated:

$$\vec{H} = \frac{I}{2\pi r} d\vec{r} \times d\vec{l} = \frac{I_1}{2\pi r_1} \begin{pmatrix} -\cos\theta_{curr}^1 \\ -\sin\theta_{curr}^1 \\ 0 \end{pmatrix} + \frac{I_2}{2\pi r_2} \begin{pmatrix} -\cos\theta_{curr}^2 \\ -\sin\theta_{curr}^2 \\ 0 \end{pmatrix}, \quad (5)$$

where $\theta_{curr}^1$ and $\theta_{curr}^2$ are the angles formed respectively by the two current lines $L_1$ and $L_2$ with the axis of easy magnetization of the hard layer.

In applying the foregoing to two lines, the first line being situated at a distance $d_1$ above the soft layer and the second line being situated at a distance $d_2$ below the soft layer, for two currents of the same intensity circulating respectively in the first line and in the second line, the intensities H1 and H2 of the fields generated respectively by the first and second lines in the vicinity of the soft layer are such that:

$$\frac{H_1}{H_2} = \frac{d_2}{d_1}.$$

So, the choice of the direction of the two current lines, of the direction and of the intensity of the two currents traversing them allows the direction and intensity of the magnetic field generated and therefore the direction of the magnetization under the field to be chosen accurately. This approach may be generally applied to n conductive wires. This example is only illustrative; generally, any choice of the position of the lines in the three dimensions (indicated by a choice of topology of the interconnection layers) of the direction and the value of each current may be used to perform a relatively complex logic function as we shall see in detail below using two examples of performing a Magnetic Full Adder [MFA] logic function. Magnetic Full Adder means an adder that contains a carry input [CI] and a carry output [CO] such that it may be interfaced with another magnetic full adder.

In addition, the intensity of the magnetic field generated depends directly upon the intensity of the current passing through the line. Consequently, by adding the input currents arriving on the same line through the ad hoc interconnection of several conductive wires arriving on the said line (Kirchhoff Laws), the intensity value of the magnetic field may be modified, with the intensity of a field generated thereby being, for example, twice as high for a line through which a current 2×I is passing than for a line situated at the same distance from the soft layer and through which a current I is passing.

It is known that the processors contain four operational systems, as follows:
  the memory circuits (code, data),
  the control circuits (the bus arbiters, the energy management blocks, . . . ),
  the input-output circuits allowing dialogue between the processor circuits ("on-chip") or with external circuits ("off-chip"),
  the processor "core" or "datapath" dedicated to processing information (i.e. carrying out the calculation itself).

Figure 3:
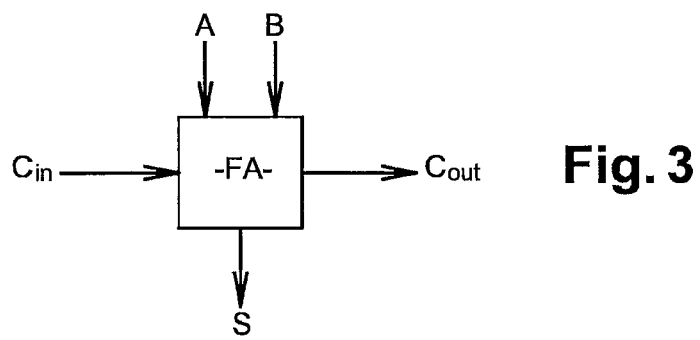
FIG. 3 represents a complete binary adder on 1 bit.

The "standard" core of a processor generally consists of a series of interconnected operating blocks, carrying out basic purely logical combinations of operations ("AND", "OR", etc.) or arithmetical operations (addition, multiplication, comparison, shifts) all directed by the control blocks. For the intended application, preference will be given to the processor speed (calculating time to carry out a given operation, with the speed often being dependant on the type of operation according to the relative critical paths in the core and the type of data to be processed) or the maximum energy to be spent on a given operation. A large part of the current cores work on 32 bit or 64 bit words. With the same operation having to be carried out on each of the bits of the word, the core therefore consists (for a 32 bit word, for example) of 32 identical slices working in parallel: each slice operates on 1 bit of data ("bit-sliced architecture"). The production of a 32 bit core therefore refers to the production and optimization of a single slice that will be repeated as many times as the number of bits composing the word. This approach is in particular valid for an adder that is one of the constituents of the core. Addition is also the most used arithmetic operation but it is also the block that limits the core in terms of processing speed. The architecture of the adder is therefore critical. Currently, there are a certain number of approaches (in CMOS technology) aimed at optimizing it. There is circuit level or logic level optimization (such as the "carry lookahead adder"). A full binary adder FA is illustrated in FIG. 3. A and B are the bits to be added. $C_{in}$ ("carry in") represents the carry arising from a previous summation (in the case of a summation on n bits) and $C_{out}$ ($C_{in}$ of the next adder) represents the carry resulting from the calculation ("carry out"). The truth table of such an FA adder is given in Table 2 below.

TABLE 2

| A | B | $C_{in}$ | S | $C_{out}$ |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

Figure 4:
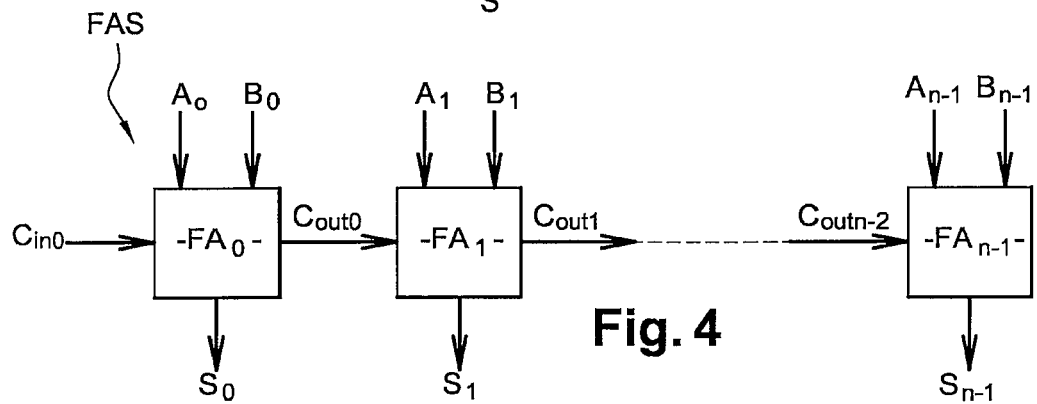
FIG. 4 represents a complete binary adder on n bits.

There are several types of CMOS architecture allowing the realization of a full binary adder (Static Adder, Mirror Adder, Transmission-Gate-Based-Adder) and the objectives are mainly to minimize the silicon cost and the calculating time of the full adder on n bits. An n bit adder may be produced by cascading n $FA_0$ to $FA_{n-1}$ adders, with each adder being an adder as represented in FIG. 3. One example of such a full FAS adder on n bits in series is represented in FIG. 4. In this configuration, the $Cout_i$ output carry of the $FA_i$ adder is injected into the carry input of the $FA_{i+1}$ adder. This structure shows that the calculation time $t_p^{adder}$ (or the full adder propagation time) mainly depends upon the time for calculating the carry as well as its propagation through the chain (therefore depending on the number n of bits). Where this increases, it is necessary to use an approach for optimizing the logic-system to reduce the propagation time, going from a linear complexity such as here ($t_p^{adder} \propto n$) to a root of n or logarithmic complexity ($t_p^{adder} \propto \sqrt{n}$) or ($t_p^{adder} \propto \ln n$), for example by implementing the carry lookahead adders.

According to one particularly advantageous embodiment of the present invention, it is possible to go from a purely CMOS technology as described above to a technology that combines the magnetic technology with the CMOS technology to realize a hybrid full adder circuit, with the whole of the calculation being carried out by the magnetic part. FIG. 5 illustrates the architecture of a device for carrying out an adder type 1 logic function according to the invention.

Adder 1 has three logic inputs A, B $C_{in}$, with A and B constituting the bits to be added and $C_{in}$ constituting the carry of the previous adder, and two logic outputs S and $C_{out}$ respectively constituting the sum and the carry as defined with reference to the truth table in Table 2. The logic inputs A, B and $C_{in}$ correspond to voltage levels corresponding to the mass if the logic value is 0 and to a bias voltage of an MOS transistor gate if the logic value is 1.

Adder 1 consists of:
a first block 2 input interface produced using CMOS technology for generating signals for currents $I_A$, $I_B$ and $I_{Cin}$ flowing through three interconnection lines whose direction depends on the logic information applied on input;
a second block 7 for generating the sum S;
a third block 8 for generating the carry $C_{out}$.

The second block 7 for generating the sum S consists of:
a magnetic part 3 operating in differential mode and generating two magnetoresistive information outputs I1 and I2;
an output interface 4 produced using CMOS technology to convert the magnetoresistive information I1 and I2 into a CMOS S compatible voltage.

Similarly, the third block 8 for generating the $C_{out}$ carry contains:
a magnetic part 5 operating in differential mode and generating two magnetoresistive information outputs I3 and I4;
an output interface 6 produced using CMOS technology to convert the magnetoresistive information I3 and I4 into a CMOS $C_{out}$ compatible voltage.

The hybrid adder 1 is presented as a system in which the magnetic parts 3 and 5 (as well as the topology of the interconnection system, as we shall see below) carry out the arithmetic operation and the CMOS part (input interface 2 and the two output interfaces 4 and 6) is used as the interface with the external world.

One method for producing input interface 2 is shown in FIG. 6(a). This interface 2 illustrates the generation of the current $I_A$ from the logic information A. Two other similar circuits may be used to generate $I_B$ from B and $I_{Cin}$ from $C_{in}$.

In accordance with the invention, input interface 2 is produced entirely in CMOS technology. This interface 2 contains four 202-205 transistors mounted in pairs in CMOS inverters connected in series. In the present case, the transistors of the pair 202-203 are the PMOS type, whilst the transistors of the pair 204-205 are NMOS type (respectively for Positive Metal Oxide Semiconductors and Negative Metal Oxide Semiconductors).

The PMOS 202 and 203 transistors (symbolized by a circle attached to their gates) have their common source connected to a positive VDD voltage supply and the NMOS 204 and 205 transistors have their common sources connected to the earth.

The PMOS 202 and NMOS 204 transistors have their common drains and the PMOS 203 and NMOS 205 have their common gates, with the common drain of the 202 and 204 transistors being linked to the common gate of the 203 and 205 transistors.

The PMOS 203 and NMOS 205 transistors have their common drains linked to a supply source equal to half the positive VDD voltage.

The PMOS 202 and NMOS 204 transistors have their common gates and receive logic information A on this gate. In accordance with CMOS logic, this logic information A is codified in the form of zero voltage if the binary information is 0 (such that the NMOS 204 transistor is blocked and the PMOS 202 transistor is in a busy state) and in the form of a positive voltage level if the binary information is 1 (such that the NMOS 204 transistor is in a busy state and the PMOS 202 transistor is blocked).

So, if the logic information to be transmitted is "'A'=0", the NMOS 204 and PMOS 203 transistors are "off", whilst the PMOS 202 and NMOS 205 transistors are "on", and reciprocally if "'A'=1" the NMOS 204 and PMOS 203 transistors are "on", whilst the PMOS 202 and NMOS 205 transistors are "off".

L designates the interconnection line in which the current $I_A$ representative of the logic information A circulates. In considering as positive the current I input in line L forming the interconnection system (linked to the drains and biased to positive VDD/2) and as negative the output current, the following equivalence may then be written in reference to FIGS. 6(b) and 6(c):

$$A = `0` \Leftrightarrow I_A = -I \qquad \text{[FIG. 6(c)]}$$

$$A = `1` \Leftrightarrow I_A = I. \qquad \text{[FIG. 6(b)]}.$$

So, current $I_A$ will be negative where the information A is '0' and positive where the information A is '1'.

I designates the absolute value of the current generating a local field H at the centre of the soft layer used in a device according to the invention and sufficiently intense to allow passage from the parallel state to the anti-parallel state. This "current mode" approach also allows the possibility of envisaging working with relatively low voltage supplies (which is interesting in the current "downscaling" trend).

As the writing current flows in the interconnection line L according to opposing directions (send or return), it is sometimes described as bidirectional current.

So, contrary to the CMOS logic where the information is codified in the form of a voltage level, the logic of the magnetic part uses equivalent levels of current for both of the binary values but for opposite directions.

Input block 2 allows conversion of the logic information into voltage mode (CMOS compatible levels) into a current whose level is sufficient to modulate the magnetic state of the magnetoresistive stacks through fields generated in the interconnection circuits.

Output interfaces 4 and 6 are produced in CMOS technology. FIG. 7 illustrates an embodiment of output interface 4, and output interface 6 may be produced identically.

FIG. 7 therefore illustrates output interface 4, electrically connected through two interconnection conductive lines L1 and L2 to the magnetic part 3 (to which we shall return later) receiving logic information codified in the form of current +I or −I of the part of input interface 2. The magnetic part 3 has two magnetoresistive stacks biased with the aid of the positive VDD voltage source and respectively generating a current I1 and I2 in the conductive lines L1 and L2, with these currents depending on the electrical resistance of each stack (this resistance itself depending on the orientation of the magnetic field of the soft layer compared with the orientation of the magnetic field of the reference hard layer).

Output interface 7 consists of:
a "clamp" 302 circuit;
a differential current 303 mirror circuit;
a buffer amplifier element 304.

The 302 "clamp" circuit (forming a voltage limiter) consists of two PMOS transistors whose gates are linked, with each PMOS transistor receiving respectively on its source current I1 and current I2. Both of these PMOS clamp transistors limit the $V_{bias}$ voltage bias of the magnetoresistive stacks by means of regulation operated by acting on the $V_{clamp}$ voltage which is applied to the two gates.

As FIG. 7 shows, the current from the drains of each of these PMOS transistors is then compared using a mirror of the 303 differential current. To form such a mirror of the 303 differential current, two NMOS transistors are used whose gates are transferred to the drain potential of one of them so as to generate the differential current $\Delta i_{read}$ which attacks the buffer amplifier 304 or output buffer. This differential current $\Delta i_{read}$ is representative of the difference of read is resistance ΔR between the two magnetoresistive stacks.

According to the direction of the current $\Delta_{read}$, the differential 303 mirror current charges or discharges the buffer amplifier element 304. The role of this buffer element is to re-generate the digital information by converting it into the form of an S voltage compatible with the logic levels of CMOS components.

The output interface allows conversion of the magnetoresistive information I1 and I2 into CMOS compatible voltage. So for example:
for a ΔR>0, 'S=1' (i.e. S has a voltage level corresponding to a logic 1);
for a ΔR<0, 'S=0' (i.e. S has a zero voltage level corresponding to a logic 0).

FIG. 8 represents a three dimensional view according to an xyz orthogonal reference frame (with x designating the axis of the abscissas and y designating the axis of the ordinates (y-axis) such that xy forms the horizontal plane and z designates the vertical axis) with a method of realizing the magnetic circuit 9 of the adder device as represented in FIG. 5 including the magnetic part 3 for generating the sum and the magnetic part 5 for generating the carry.

The magnetic part 3 for generating the sum consists of:
a first MTJ1 magnetoresistive stack including a hard ferromagnetic layer and a soft ferromagnetic layer separated by a non-ferromagnetic interlayer;
a second MTJ1 magnetoresistive stack including a hard ferromagnetic layer and a soft ferromagnetic layer separated by a non-ferromagnetic interlayer.

It will be seen that the different layers of both the MTJ1 and MTJ2 stacks are not represented out of a concern for clarity. The soft ferromagnetic layer is produced in a magnetically soft material such as Permalloy for example. Its magnetization responds quite well to the variations in an external magnetic field applied to it. This layer should be quite fine so that its magnetization can have a substantial effect on weak magnetic fluxes. The hard ferromagnetic layer has a fixed magnetization. In addition, the non-ferromagnetic junction interlayer may be made of Magnesium Oxide (MgO): this material allows a high Tunnel Magnetic Resistance [TMR] and a weak nominal resistance to be obtained. As a reminder, the electrical resistance of a stack of magnetic layers is given in the first approximation (weak voltage bias and ambient temperature) by the equation:

$$R_{MTJ} = R_p(1 + TMR \cdot (1 - \cos \theta)/2)$$

where:
$R_p$ is the nominal resistance of the magnetoresistive stack where the magnetization of both layers of the stack is oriented in the same direction;
TMR represents the magnetoresistance tunnel, that is, the relative variation in resistance between extreme states of orientation;
θ is the angle formed between the orientation of the hard and soft layers.

So, where θ equals 0, the magnetoresistive stack is in a parallel state in which the resistance of the stack in its parallel state $R^P$ reaches its minimum and equals $R_{MTJ}^P = R_p$, and where θ=π, the magnetoresistive stack is in an anti-parallel state and the electrical resistance of the stack in its anti-parallel state $R_{MTJ}^{ap}$ is maximum and equals $R_{MTJ}^{ap} = R_p \cdot (1 + TMR)$.

The soft layers should have circular or quasi-circular shape so as to minimize the write current required to modulate their magnetic orientation. Generally, the stacks used have the shape of circular or quasi-circular and non-elliptical section contacts: contrary to memory, this search is aimed at obtaining magnetoresistive stacks produced so that the stability of the easy magnetization axes are weak, such that a weak magnetic field is sufficient to move them from this position, as the aim here is not the stable maintenance of the information as in the case of memory.

The upper part of the MTJ1 and MTJ2 stacks are connected by a common 10 upper electrode with bias appreciably directed along the x axis. This upper electrode is connected to a positive voltage Vdd magnetization 12 directed along the y axis using a vertical conductive via 11.

The lower part of the MTJ1 stack is connected by a lower electrode 14 connected to a vertical conductive via 16. This conductive via 16 supplies the current I1 forming the input of the output interface 3 illustrated in FIGS. 5 and 7.

The lower part of the MTJ2 stack is connected by a lower electrode 13 connected to a vertical conductive via 15. This conductive via 15 supplies the current I2 forming the input of the output interface 3 illustrated in FIGS. 5 and 7.

As we have already mentioned above, the magnetic circuit 9 is produced using multiple interconnection layers consisting of alternating conductive layers also called "metallization levels" provided with metalized conductive lines extending parallel to the said layers and insulating layers (not represented) traversed by conductive vias allowing an electrical connection between two metallization levels. A metallization level includes multiple conductive lines surrounded by areas produced in dielectric material.

The magnetic circuit 9 is formed by three metallization levels N1 to N3 that allow injection of the input currents $I_A$, $I_B$ et $I_{Cin}$ transmitted by input interface 2 as illustrated in FIG. 6. It will be seen that the upper electrode 10 and the lower electrodes 13 and 14 of the MTJ1 and MTJ2 magnetoresistive stacks respectively form two other metallization levels not referenced in FIG. 8.

We shall describe below the three metallization levels N1 to N3 in greater detail.

Each metallization level is formed by one or more current lines aimed at orienting the magnetic fields of the various soft layers present:
  metallization level N1 is represented by chevrons;
  metallization level N2 situated above metallization level N1 is represented by dense dots;
  metallization level N3 situated above metallization level N2 is illustrated by more scattered dots for level N2.

The magnetic part 3 for sum generation includes three conductive lines 17, 18 and 19 respectively belonging to the metallization levels N1, N2 and N3. FIGS. 9 and 10 represent respectively view of the magnetic part 3 for sum generation in the xy plane (view from above) and xz (frontal view).

The MTJ1 and MTJ2 stacks are represented by dots in FIG. 9 with a solid arrow symbolizing the magnetic orientation of the reference hard layer. The magnetization of each of the hard layers of both the MTJ1 and MTJ2 stacks is positioned in the same direction (it will also be noted that the same orientation of the hard layer is used for both of the other hard layers of the MTJ3 and MTJ4 stacks described later on).

Three vertical conductive vias 20, 21 and 22 for accessing the CMOS input interface as represented in FIGS. 5 and 6 are respectively electrically connected to lines 17, 18 and 19. Vertical via 20 allows injection of the current $I_B$+/−I (corresponding to voltage level B) in line 17. Vertical via 21 allows injection of current $I_A$+/−I (corresponding to voltage level A) in line 18. Vertical via 2 allows injection of the current $I_{Cin}$+/−I (corresponding to voltage level $C_{in}$) in line 19.

To clarify, vias 20, 21 and 22 and electrodes 10, 13 and 14 have not been represented in FIGS. 9 and 10.

It is important to state that at each moment (each step in the calculation) the stacks are in balance under fields: the balance is maintained whilst the current is applied (that is, during the operation of the circuit) and is lost when the current is not applied.

In what follows, the distance between a current line and a magnetoresistive stack is understood as the distance separating the centre of the soft layer and the point of the line nearest the centre of the soft layer.

Current line 18 (in the intermediate N2 metallization layer) that will be called the "magnetic polarization line" is a line directed along the x axis, at the same time passing under the MTJ1 magnetoresistive stack and under the MTJ2 magnetoresistive stack at a distance d following the vertical z axis. It will be noted that current line 18 could also be above the MTJ1 and MTJ2 stacks at the same distance d and produce the same effect (with a current traversing it in the opposite direction).

Current line 19 (with upper N3 metallization level) is a line substantially in the form of a U both of whose parallel branches 23 and 24 follow the y axis and are situated above the MTJ1 and MTJ2 stacks at double the distance 2×d compared with the distance d separating line 18 from the MTJ1 and MTJ2 stacks.

Current line 17 (with lower N1 metallization layer) is a line following the y axis and is situated only below the MTJ1 stack at a double distance 2×d compared with the distance d separating line 18 from the MTJ1 stack.

In addition, current line 17 is electrically connected to current line 19, at the level of its branch 24, using vertical interconnection via 25 such that the current in lines 17 and 19 are added before being routed on branch 23 of current line 19 producing its effects on the MTJ2 stack.

Consequently, for the first magnetoresistive stack MTJ1, lines 19 and 17 providing the currents $I_{Cin}$ et $I_B$ are on either side of the MTJ1 stack and equidistant from it whilst current line 18 providing current $I_A$ is under MTJ1 (or above) at a half distance that is less important than the other two lines 19 and 17. So, for a given current I allowing rotation of the magnetization of the soft layer of the MTJ1 stack from the parallel state to the anti-parallel state, the field generated at the centre of the soft layer by line 18 is twice as intense as that generated by lines 19 and 17.

Regarding MTJ2, this has the same configuration as line 18 undergoing an influence identical to MTJ1; conversely, the currents in lines 17 and 19 are added together (Kirchhoff Laws) and this sum is routed on the branch of line 19 above the MTJ2 magnetoresistive stack at a distance double that associated with line 18. It will be noted that the currents of lines 17 and 19 could have been added together and taken a line 17 in a U and a line 19 situated only above the MTJ1 stack. In this case, the sum of the currents would have been routed on the branch of line 17 below the MTJ2 stack at a distance double that associated with line 18.

We shall now assess the reaction of the magnetic part 3 for generating the sum of the different possible configurations. The hypotheses advance earlier will be taken. So, on input, it will be taken that '0' ⇔ −I and that '1' ⇔ I. In the same way, on output, this will give:

$$\Delta R = R_{MTJ1} - R_{MTJ2} > 0 \Rightarrow S = \text{'}1\text{'} \text{ and,}$$

$$\Delta R = R_{MTJ1} - R_{MTJ2} < 0 \Rightarrow S = \text{'}0\text{'}.$$

$R_{MTJi}^P$ will denote the resistance of the MTJi magnetoresistive stack in its parallel or substantially parallel state and $R_{MTJi}^{ap}$, the resistance of the MTJi stack in its anti-parallel or substantially anti-parallel state. We will call $R_{MTJi}^{int}$ the resistance of the MTJi in an intermediate state (with θ being between 0 and π) between $R_{MTJi}^{ap}$ and $R_{MTJi}^{p}$ such that: $R_{MTJi}^{ap} > R_{MTJi}^{in} > R_{MTJi}^{p}$.

So, the table for generating the magnetic fields seen by each of the MTJ1 and MTJ2 stacks for the various combinations of the input vector A, B and $C_{in}$ can be written as indicated in Table 3 as follows:

TABLE 3

| A | B | $C_{in}$ | $I_A$ | $I_B$ | $I_{CIN}$ | $H_{MTJ1}^x$ | $H_{MTJ1}^y$ | $H_{MTJ2}^x$ | $H_{MTJ2}^y$ |
|---|---|---|---|---|---|---|---|---|---|
| 0 | 0 | 0 | −I | −I | −I | $\frac{-H}{2} + \frac{H}{2} = 0$ | +H | $\frac{-2H}{2} = -H$ | +H |
| 0 | 0 | 1 | −I | −I | +I | $\frac{-2H}{2} = -H$ | +H | $\frac{-H}{2} + \frac{H}{2} = 0$ | +H |
| 0 | 1 | 0 | −I | +I | −I | $\frac{+2H}{2} = +H$ | +H | $\frac{-H}{2} + \frac{H}{2} = 0$ | +H |
| 0 | 1 | 1 | −I | +I | +I | $\frac{H}{2} - \frac{H}{2} = 0$ | +H | $\frac{+2H}{2} = +H$ | +H |
| 1 | 0 | 0 | +I | −I | −I | $\frac{-H}{2} + \frac{H}{2} = 0$ | −H | $\frac{-2H}{2} = -H$ | −H |
| 1 | 0 | 1 | +I | −I | +I | $\frac{-2H}{2} = -H$ | −H | $\frac{-H}{2} + \frac{H}{2} = 0$ | −H |
| 1 | 1 | 0 | +I | +I | −I | $\frac{+2H}{2} = +H$ | −H | $\frac{-H}{2} + \frac{H}{2} = 0$ | −H |
| 1 | 1 | 1 | +I | +I | +I | $\frac{H}{2} - \frac{H}{2} = 0$ | −H | $\frac{+2H}{2} = +H$ | −H |

H represents the intensity of the field generated in the vicinity of the soft layer by a current I circulating in a current line situated at a distance d from the center of the soft layer of the MTJi magnetoresistive stack. Consequently, for a line situated at a distance 2×d, the intensity of the field generated will be equal to H/2.

$H_{MTJi}^x$ and $H_{MTJi}^y$ represent the components along the x and y axes of the magnetic field vector generated in the vicinity of the soft layer of the MTJi stack.

The values of the components $H_{MTJi}^x$ et $H_{MTJi}^y$ for the MTJ1 and MTJ2 magnetoresistive stacks can be used to deduce the final truth table giving, according to the fields obtained, the resistive states of each of the magnetoresistive stacks $R_{MTJ1}$ et $R_{MTJ2}$, the resistance variation sgn(ΔR) (where sgn( ) designates the sign function) and the output binary value in the form of a voltage S generated by output interface 4 represented in FIG. 7. This truth table is shown in Table 4 below. Detection by the output interface is made under fields: this is the combination of the magnetic fields generated by each of the inputs and via the special interconnection network for each of the two magnetic parts 3 and 5 (carry, sum) which are going to stabilize the magnetic states during the read time. It is therefore preferable to use rapid differential amplifiers allowing both a low adder propagation time (high calculation speed) and reduced input information "hold" time, also reducing operating consumption. To opt for a relatively low nominal resistance for the magnetoresistive stack and a high tunnel magnetoresistance (in particular by using the MgO) is a substantial advantage in the read speed (strong relative and absolute currents reduce the amplifier response time).

TABLE 4

| $H_{MTJ1}^x$ | $H_{MTJ1}^y$ | $H_{MTJ2}^x$ | $H_{MTJ2}^y$ | $R_{MTJ1}$ | $R_{MTJ2}$ | sgn(ΔR) | S |
|---|---|---|---|---|---|---|---|
| 0 | +H | −H | +H | $R^P$ | $R^{INT}$ | ΔR < 0 | 0 |
| −H | +H | 0 | +H | $R^{INT}$ | $R^P$ | ΔR > 0 | 1 |
| +H | +H | 0 | +H | $R^{INT}$ | $R^P$ | ΔR > 0 | 1 |

TABLE 4-continued

| $H_{MTJ1}^x$ | $H_{MTJ1}^y$ | $H_{MTJ2}^x$ | $H_{MTJ2}^y$ | $R_{MTJ1}$ | $R_{MTJ2}$ | sgn(ΔR) | S |
|---|---|---|---|---|---|---|---|
| 0 | +H | +H | +H | $R^P$ | $R^{INT}$ | ΔR < 0 | 0 |
| 0 | −H | −H | −H | $R^{AP}$ | $R^{INT}$ | ΔR > 0 | 1 |
| −H | −H | 0 | −H | $R^{INT}$ | $R^{AP}$ | ΔR < 0 | 0 |
| +H | −H | 0 | −H | $R^{INT}$ | $R^{AP}$ | ΔR < 0 | 0 |
| 0 | −H | +H | −H | $R^{AP}$ | $R^{INT}$ | ΔR > 0 | 1 |

It could be arranged for the fields generated on the x axis (perpendicular to the magnetization of the hard layers) to be more intense than the fields generated on the y axis to allow effective saturation of the soft layers in the direction considered and thereby to maximize the relative resistance variation, that is: $H_{MTJi}^x > H_{MTJi}^y$.

The sum S can be obtained in accordance with the truth table of the "Binary Full Adder" FA given in Table 2. It will be noted that currents with identical density traversing the conductors on either side of a magnetoresistive stack are going to generate fields of opposite direction if these currents are in the same direction, and a maximum field if these currents are in opposite directions: this is the case with the MTJ1 stack. Regarding MTJ2, if the currents summed have opposite directions, the effect is cancelled and the field generated is null; if they are both in the same direction, the field is maximum.

The carry generating magnetic part 5 consists of:
A third magnetoresistive stack including a hard ferromagnetic layer and a soft ferromagnetic layer separated by a non-ferromagnetic interlayer;
A fourth magnetoresistive stack MTJ4 formed by a hard ferromagnetic layer and a soft ferromagnetic layer separated by a non-ferromagnetic interlayer.

As for the MTJ1 and MTJ2 stacks, the various layers of both of the MTJ3 and MTJ4 magnetoresistive stacks are not represented, for reasons of clarity. The soft ferromagnetic layer is produced using a soft magnetic material such as Permalloy. Its magnetization responds easily to the variations in an external magnetic field applied to it. This layer should be quite fine so that its magnetization can shift substantially under the effect of weak magnetic fluxes. The hard ferromagnetic layer has a pinned magnetization. In addition, the non-ferromagnetic junction interlayer may be made of MgO.

The soft layers should have circular or quasi-circular shape so as to minimize the write current required to modulate their magnetic orientation.

The magnetization of the hard layers of the MTJ3 and MTJ4 stacks are positioned in the same direction as those for the MTJ1 and MTJ2 stacks.

The upper part of the MTJ3 and MTJ4 stacks are connected by a common upper electrode 26 with polarization substantially long the y axis. This upper electrode is connected to the rail 12 with positive supply voltage through a vertical conductive via 27.

The lower part of the MTJ3 stack is connected by a lower electrode 28 substantially following the y axis and connected to a vertical conductive via 29. This conductive via 29 supplies the current I3 forming the input of output interface 5 shown in FIG. 5.

The lower part of the MTJ4 stack is connected by a lower electrode 30 substantially directed along the y axis and connected to a vertical conductive via 31. This conductive via 31 supplies the current I4 forming the input of output interface 5 shown in FIG. 5.

The carry generation magnetic part 5 also includes a conductive line 32 belonging to metallization level N1 (same level as conductive line 17). FIG. 11 shows a via of the carry generation magnetic part 5 in the xy plane (view from above).

The MTJ3 and MTJ4 stacks are shown in the form of a solid circle in cross-hatched lines in FIG. 11 with a sold arrow symbolizing the magnetic orientation of the reference hard layer.

Current line 32 is a line substantially in the shape of a U both of whose parallel branches 33 and 34 follow the x axis and are situated respectively below the MTJ3 and MTJ4 stacks at a distance d identical to the distance separating current line 18 from the MTJ1 and MTJ2 stacks. The U shape of current line 32 for the same direction of current allows the generation of opposite magnetic fields in each of the MTJ3 and MTJ4 stacks.

The carry generation magnetic part 5 also includes two vertical conductive vias 35 and 36 electrically connecting current line 32 respectively to current line 18 through which current $I_A$ travels and to portion 23 of current line 19 through which the sum of the currents $I_B+I_{Cin}$ travels.

The sum of the 3 currents $I_A+I_B+I_{Cin}$ flows through current line 32 dedicated to the carry. As for the carry generation magnetic part 3, the table may be written for the generation of magnetic fields seen by each of the MTJ3 and MTJ4 stacks for the various combinations of the A, B and $C_{in}$ vector entries. This table is shown in Table 5 below:

TABLE 5

| A | B | $C_{in}$ | $I_A$ | $I_B$ | $I_{CIN}$ | ΣI | $H_{MTJ3}$ | $H_{MTJ4}$ |
|---|---|---|---|---|---|---|---|---|
| 0 | 0 | 0 | −I | −I | −I | −3I | −3H | +3H |
| 0 | 0 | 1 | −I | −I | +I | −I | −H | +H |
| 0 | 1 | 0 | −I | +I | −I | −I | −H | +H |
| 0 | 1 | 1 | −I | +I | +I | +I | +H | −H |

TABLE 5-continued

| A | B | $C_{in}$ | $I_A$ | $I_B$ | $I_{CIN}$ | ΣI | $H_{MTJ3}$ | $H_{MTJ4}$ |
|---|---|---|---|---|---|---|---|---|
| 1 | 0 | 0 | +I | −I | −I | −I | −H | +H |
| 1 | 0 | 1 | +I | −I | +I | +I | +H | −H |
| 1 | 1 | 0 | +I | +I | −I | +I | +H | −H |
| 1 | 1 | 1 | +I | +I | +I | +3I | +3H | −3H |

Contrary to the case for the magnetic part for which three resistance values can be obtained, the fields here are only generated on the y axis relating to the magnetization of the hard layer so that there is either a resistance $R_{MTJi}^{P}$ for the MTJi magnetoresistive stack in its parallel or substantially parallel state or a resistance $R_{MTJi}^{ap}$ for the MTJi magnetoresistive stack in its anti-parallel or substantially anti-parallel state. H represents the intensity of the field generated in the vicinity of the hard layer by a current I flowing through a current line situated at distance d from the centre of the soft layer of the MTJi stack.

It will be noted that current line 32 of the carry generation magnetic part 5 also includes a vertical conductive via 37 connected to the positive voltage source Vdd/2 which allows the generation of bidirectional currents as shown in FIG. 6.

The values of the field for the MTJ3 and MTJ4 stacks can be used to deduce the final truth table giving, according to the fields obtained, the resistive states of each of the stacks $R_{MTJ3}$ and $R_{MTJ4}$, the resistance variation sign sgn(ΔR) (where sgn( ) designates the sign function and $\Delta R=R_{MTJ3}-R_{MTJ4}$) and the output binary value in the form of a voltage $C_{out}$ generated by output interface 6 shown in FIG. 5. This truth table is shown in Table 6 below.

TABLE 6

| $H_{MTJ3}$ | $H_{MTJ4}$ | $H_{MTJ3}$ | $H_{MTJ4}$ | sgn(ΔR) | $C_{out}$ |
|---|---|---|---|---|---|
| −3H | +3H | $R^P$ | $R^{AP}$ | ΔR < 0 | 0 |
| −H | +H | $R^P$ | $R^{AP}$ | ΔR < 0 | 0 |
| −H | +H | $R^P$ | $R^{AP}$ | ΔR < 0 | 0 |
| +H | −H | $R^{AP}$ | $R^P$ | ΔR > 0 | 1 |
| −H | +H | $R^P$ | $R^{AP}$ | ΔR < 0 | 0 |
| +H | −H | $R^{AP}$ | $R^P$ | ΔR > 0 | 1 |
| +H | −H | $R^{AP}$ | $R^P$ | ΔR > 0 | 1 |
| +3H | −3H | $R^{AP}$ | $R^P$ | ΔR > 0 | 1 |

A carry $C_{out}$ is obtained in accordance with the truth table of the "Binary Full Adder" FA given in Table 2. It will be noted that carry generation circuit 5 behaves as a majority voting circuit: in fact, the truth table of the adder shows that if the number of 0s on input is higher than the number of 1s then the value of the carry is 0 and conversely for 1, with this operation being more difficult to carry out in classic CMOS logic, as the complete circuit requires a significant number of transistors. Here, the sum of the bidirectional currents, of identical intensity and a magnetic differential system calibrated at a rollover threshold of H/I allows this operation to be carried out easily. It should be recalled that a majority voting circuit is a component comprising a certain number of logic inputs and a logic output. This output is "1" if the number of "1"s on input is higher than the number of "0"s. In this definition, it will be noted that such a device only has any sense if the number of inputs is an odd number. Table 7 shows the truth table for a majority voting circuit with 3 inputs.

TABLE 7

| a | b | c | Sv |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

By comparing Table 2 and Table 7 and by taking "a" as equal to "A", "b" equal to "B", "c" equal to "$C_{in}$," and "SV" equal to "$C_{out}$," we have the same truth table.

Therefore, the invention can combine the magnetic technology based on the MTJ magnetoresistive stack in first generation Field Induced Magnetic Switching [FIMS] i.e. magnetization of the soft layer modified through the application of a magnetic field generated by a current line in the vicinity of the magnetoresistive stack) with the CMOS technology to produce a "Binary Full Adder" hybrid. This architecture is used for the application of intensive calculations requiring relatively high performance, relatively low dynamic consumption and strong integration density.

The architecture of this adder therefore consists of 3 blocks, as follows: a first block consisting of CMOS buffers provisioned as a result to allow the generation of bidirectional currents injected into the interconnection system of the magnetic part. Bi-directionality is ensured by biasing the routing lines at half the circuit magnetization voltage. As each of the inputs (A, B and $C_{in}$) have equivalent relative weights in calculating the addition, the associated buffers will have equivalent size. Therefore, the buffers steer 3 interconnection lines generating in each of them a current whose direction depends on the logic information applied on input. These lines traverse both the differential magnetic structures generating the local fields according to the currents and of the routing topology. It is this topology that will "functionally" differentiate the sum generation magnetic parts and the output carry generation magnetic parts (the magnetic reactions of both magnetic parts being different for the same stimulus). The use of a pair of magnetoresistive stacks operating in differential mode can benefit from the common mode rejection of read amplifiers and therefore have good immunity from noise. Thus, a resistance variation ΔR is obtained that is "positive or negative" depending on the direction of the local field applied and therefore on the combination of the currents injected into the lines. This resistance variation is generated in the form of a differential current by the CMOS stage (differential amplifier) and converted in the form of a voltage to obtain the corresponding logic information, the sum for one block and the carry for the other, with this being transmitted to the following block for calculation on n bits. Later, we shall see that it is also possible to transmit this information directly in the form of a current: as a result, to a certain extent, we can abstain from "actually calculating" the intermediate carries (that is, regenerate these carries in the form of logic levels using the CMOS circuitry).

This architecture has a certain number of advantages compared with the equivalent CMOS circuits, the first being the dissociation between circuits generating input stimuli in current mode (the data to be added) and results generating circuits that increase the overall performance of the system and limit the dynamic power consumed in carry out calculations. This is especially true with differential magnetic structures used requiring relatively weak currents. There is no contact between the issuer of the stimuli and the magnetic part: consequently, the calculation operation in itself uses practically no power.

A second advantage is the dissociation between the calculation of the carry and that of the sum, with the operations here being completely parallel. In addition, the magnetic structures and CMOS are fully identical, which allows optimization, simplification and standardization (standard cell) of the process for producing such a component. This approach allows substantial density to be obtained for the CMOS part accentuated by the fact that the adder can use fewer than 20 transistors to operate (amplifiers+buffers).

Furthermore, the development of MRAM memory ensures compatibility of the magnetic process with the standard CMOS process (digital environment). Consequently, the magnetic part may therefore be added in post-processing above the CMOS part ("Above-IC"). In this approach, the calculation is carried out by the magnetic part with the help of low variations (induced by the combination of local fields) in the magnetization of the stacks matched around equilibrium positions. This approach, used in CMOS current mode logic (CML) for example, is very suitable for producing rapid digital circuits, with the functions being set by the interconnection routing topology allowing power modulation and in the direction of the fields. The CMOS part is solely used as an interface ensuring compatibility of the circuit with the "classic" components (regeneration of the information in voltage form).

Lastly, a fourth advantage is the possibility of abstaining from calculating or in other words the ability to regenerate the output carry in the form of a voltage, with the reading being the limiting factor (in terms of speed) of this architecture and implicitly to propagate this in the form of a current, directly in the corresponding input ($C_{in}$) of the second adder. A 4 bit adder may therefore be produced with the same overall speed as a 2 bit adder. A look at Tables 5 and 6 shows that the sign of the sum of the currents traversing current line 32 of the carry is fully correlated with the $C_{out}$ output binary information (generation of the carry by the CMOS output interface). This result is normal by design, as when there is a need to produce an n bit adder (32 "Binary Full Adder" adders are needed to add 2 words of 32 bits), it is necessary to propagate the carry stage by stage. However, calculating intermediate carries has no use since only the sum and the final carry are important. Consequently, for example, a 2 bit adder may be produced (sum of two words of 2 bits) by cascading two Binary Full Adders but being free from calculating the intermediate carry, that is, by reinjecting the sum current associated with the calculation of the carry for the first stage directly into the input line of the second stage (the intermediate output interface used to regenerate the intermediate carry is removed). This approach gives the same calculation speed for 1 bit as for 2 bits. This approach may be generally applied to an adder of n bits. The propagation time of an adder of n bits according to the invention is an average divided by 2. In addition, where there is a 2 bit adder, it does not use more than six MTJ stacks (as the stacks associated with the calculation of the carry for the first stage are not useful), three buffer amplifiers (such as amplifier 304 in FIG. 7) and five interfaces (three input interfaces and two output interfaces). Therefore, the overall size of the system is reduced and the average consumption is lowered since the current in the first stage is used in the second.

This fourth advantage is shown in FIG. 12 which shows a three dimensional view of a 2 bit adder 109 according to the invention with propagation of the carry using an xyz orthogonal reference frame. This adder 109 includes a magnetic part 103 for generating a first sum.

The first sum magnetic generation part 103 consists of:
A first. MTJ1 magnetoresistive stack;
A second MTJ2 magnetoresistive stack.

It will be noted that the various magnetoresistives used in adder 109 are identical to those described previously with reference to adder 9 in FIG. 8.

The upper part of each of the MTJ1 and MTJ2 magnetoresistive stacks are connected by a common upper electrode 110 with bias substantially directed along the x axis. This upper electrode is connected to a positive voltage rail directed along the y axis by a vertical conductive via 111.

The lower part of the MTJ1 stack is connected by a lower electrode 114 connected to a vertical conductive via 116. This conductive via 116 supplies the current forming the first input of a first CMOS output interface as shown in FIGS. 5 and 7.

The lower part of the MTJ2 stack is connected by a lower electrode 113 connected to a vertical conductive via 115. This conductive via 115 supplies the current forming the second input of the first output interface as shown in FIGS. 5 and 7.

The first output interface generates the output signal $S_0$ as shown in FIG. 4.

Magnetic circuit 109 is formed by three metallization levels N1 to N3 (identical to those described in reference to FIG. 8) which will allow the injection of:

The input currents $I_{A0}$ (corresponding to bit $A_0$ as shown in FIG. 4), $I_{B0}$ (corresponding to bit $B_0$ to be summed with $A_0$) and $I_{Cin}$ (corresponding to the input carry $C_{in0}$ as shown in FIG. 4) transmitted by a first CMOS input interface as shown in FIG. 6.

The input currents $I_{A1}$ (corresponding to bit $A_1$ as shown in FIG. 4) and $I_{B1}$ (corresponding to bit $B_1$ to be summed $A_1$) transmitted by a second CMOS input interface as shown in FIG. 6 (it will be noted here that the input interface does not supply the current corresponding to the carry $C_{out0}$ (or $C_{in1}$) since the latter will be directly propagated in the form of current by the magnetic circuit).

The first sum generation magnetic part 103 has three conductive lines 117, 118 and 119 belonging respectively to metallization levels N1, N2 and N3.

Three vertical conductive vias 120, 121 and 122 for access to the first CMOS input interface are respectively connected electrically to lines 117, 118 and 119.

Vertical via 120 allows the injection of the current $I_{B0}$+/−I into line 117. Vertical via 121 allows the injection of the current $I_{A0}$+/−I into line 118. Vertical via 122 allows the injection of the current $I_{Cin0}$+/−I in line 119.

Current line 118 (intermediate N2 metallization level) is a line directed along the x axis and passing under the MTJ1 stack and under the MTJ2 stack at a distance d following the vertical z axis. It will be noted that this current line 118 could also be above the MTJ1 and MTJ2 stacks at the same distance d and produce the same effect (with a current traversing it in the opposite direction).

Current line 118 (intermediate N2 metallization level) is a line directed along the x axis and passing both under the MTJ1 stack and the MTJ2 stack at a distance d following the vertical z axis. It will be noted that this current line 118 could also be above the MTJ1 and MTJ2 stacks at the same distance d and produce the same effect (with a current traversing it in the opposite direction).

Current line 119 (higher metallization level N3) is a line substantially in the shape of a U both of whose parallel branches 123 and 124 follow the y axis and are situated above the MTJ1 and MTJ2 stacks at a double distance 2×d compared with the distance d separating line 118 from the MTJ1 and MTJ2 stacks.

Current line 117 (lower metallization level N1) is a line following the y axis and situated only below the MTJ1 stack at a double distance 2×d compared with the distance d separating line 118 from the MTJ1 stack.

In addition, current line 117 is electrically connected to current line 119 at the level of its branch 124 through a vertical interconnection via 125 so that current lines 117 and 119 are added together before being routed on branch 123 of current line 119 producing its effects upon the MTJ2 stack.

Adder 109 contains a second sum generation magnetic part 403.

Second sum generation magnetic part 403 is structurally identical to the first sum generation magnetic part.

Second sum generation magnetic part 403 consists of:
A third MTJ1' magnetoresistive stack
A fourth MTJ2' magnetoresistive stack.

The upper part of each of the MTJ1' and MTJ2' are connected by a common upper electrode 410 with bias directed substantially along the x axis. This upper electrode is connected to rail 112 in positive voltage directed along the y axis through vertical conductive via 411.

The lower part of the MTJ1' stack is connected by lower electrode 414 connected to vertical conductive via 416. Conductive via 416 supplies the current forming the first input of a second CMOS output interface as shown in FIGS. 5 and 7.

The lower part of the MTJ2' stack is connected by lower electrode 413 connected to vertical conductive via 415. Conductive via 415 supplies the current forming the second input of the said second output interface as shown in FIGS. 5 and 7.

The second output interface generates the output signal $S_1$ as shown in FIG. 4.

Second sum generation magnetic part 403 has three conductive lines 417, 418 and 419 belonging respectively to metallization levels N1, N2 and N3.

Two vertical conductive vias 420 and 421 for accessing the CMOS input interface are respectively electrically connected to lines 417 and 418.

Vertical via 420 allows the injection of the current $I_{B1}$+/−I into line 417. Vertical via 421 allows the injection of the current $I_{A1}$+/−I into line 418.

The second sum generation magnetic part 403 also includes a conductive via 422 allowing injection of an intermediate carry current which we shall revert to later. Vertical via 422 is electrically linked to current line 419 at the level of its branch 424.

Current line 418 (intermediate metallization level N2) is a line directed along the x axis passing under the MTJ1' stack and under the MTJ2' stack at a distance d along the vertical z axis.

Current line 419 (higher metallization level N3) is a line substantially in the shape of a U both of whose parallel branches 423 and 424 follow the y axis and are situated above the MTJ1 and MTJ2 stacks at a double distance 2×d compared with distance d separating line 418 from the MTJ1 and MTJ2 stacks.

Current line 417 (lower metallization level N1) is a line following the y axis and is situated only below the MTJ1 magnetoresistive stack at a double distance 2×d compared with distance d separating line 418 from the MTJ1 stack.

In addition, current line 417 is electrically linked to current line 419 at the level of its branch 424 through a vertical interconnection via 425 such that the current in lines 417 and 419 are added together before being routed on branch 423 of current line 419 producing its effects upon the MTJ2' stack.

The adder 109 also includes carry propagation current line 132 at the N1 metallization level and two vertical conductive vias 135 and 136 electrically linking current line 132 respectively to current line 118 through which the current $I_{A0}$ travels and to portion 123 of current line 119 through which the sum of the currents $I_{B0}+I_{Cin0}$ travels.

The sum of the 3 currents $I_{A0}+I_{B0}+I_{Cin0}$ therefore flows through current line 132 dedicated to the carry propagated. Contrary to line 32 of the 1-bit adder in FIG. 8, line 132 is not used to produce a magnetic field on two magnetoresistive stacks but simply to propagate the intermediate carry in the form of a current without regenerating it in the form of a compatible CMOS voltage: this saves having one output interface and two stacks.

Current line 132 is then extended up to vertical conductive via 422 to supply the input current $I_{int0}$ of the latter.

Adder 109 includes a final carry generation magnetic part 405.

This final carry generation magnetic part 405 is structurally identical to the carry generation magnetic part 5 shown in FIG. 8. It includes:
- a fifth magnetoresistive stack MTJ3';
- a sixth magnetoresistive stack MTJ4'.

The upper part of each of the MTJ3' and MTJ4' magnetoresistive stacks is connected by a common upper electrode 426 with bias substantially along the y axis. This upper electrode is linked to the positive voltage rail 112 by vertical conductive via 427.

The lower part of the MTJ3' magnetoresistive stack is connected by lower electrode 428 substantially aligned to the y axis and linked to vertical conductive via 429. Conductive via 429 supplies the current forming the input of a third output interface as shown in FIG. 5.

The lower part of the MTJ4' magnetoresistive stack is connected by lower electrode 430 substantially aligned along the y axis and linked to vertical conductive via 431. Conductive via 431 supplies the current forming the input of the third output interface as shown in FIG. 5.

The final carry generation magnetic part 405 includes conductive line 432 belonging to metallization level N1 (the same level as conductive line 417).

Current line 432 is a line substantially in the shape of a U both of whose parallel branches 433 and 434 follow the x axis and are situated respectively below the MTJ3' and MTJ4' stacks at a distance d identical to the distance separating line 418 from the MTJ1' and MTJ2' stacks.

The U shape of current line 432 allows the generation for the same current direction of opposite magnetic fields in each of the MTJ3' and MTJ4' stacks.

It will be noted that current line 432 of the carry generation magnetic part 405 also includes a vertical conductive via 437 connected to the positive voltage source that allows the generation of bidirectional current as shown in FIG. 6.

The final carry generation magnetic part 405 also includes two vertical conductive vias 435 and 436 electrically connecting current line 432 respectively to current line 418 through which travels the current $I_{A1}$ and to portion 423 of current line 419 through which the sum of the currents $I_{B1}+I_{int0}$ travels.

The sum of the 3 currents $I_{A1}+I_{B1}+I_{int0}$ therefore flows in current line 432 dedicated to the final carry.

Adder 109 also includes a vertical via 438 connected electrically to carry propagation current line 132: we shall revert later to the use of via 438.

However, the approach proposed above provides for limiting the current $I_{int0}$ to be injected into conductive via 422 to I in absolute value; this value is exceeded for the vectors ($A_0$ $B_0$ $Cin_0$) 000 and 111. Where the input vector is 000, the sum of the currents injected is $-3 \times I$ and where the input vector is 111, the sum of the currents injected is $3 \times I$. To mitigate this problem, the CMOS 500 limiter circuit as shown in FIG. 13 to regulate the current from the input vector, an action that does not penalize performance in terms of the response time of the amplifiers on the magnetic parts that can be quite long.

The CMOS 500 limiter circuit consists of:
- three PMOS 501, 502 and 503 transistors mounted in series, with the source of the first PMOS 501 transistor being connected to the positive voltage;
- three NMOS 504, 505 et 506 transistors mounted in series, with the source of the third NMOS 506 transistor being connected to earth.

The six PMOS et NMOS transistors are mounted in series such that the drain of the first NMOS 504 transistor is connected to the drain of the third PMOS 503 transistor.

The first PMOS 501 transistor and the third NMOS 506 transistor have their common gate on which the signal $A_0$ is injected.

The second PMOS 502 transistor and the second NMOS 505 transistor have their common gate on which the signal $B_0$ is injected.

The third PMOS 503 transistor and the first NMOS 504 transistor have their common gate on which the signal $C_{in0}$ is injected.

The common drain of the first NMOS 504 transistor and the third PMOS 503 transistor is connected to carry propagation current line 132 de by the vertical conductive via 438 (also shown in FIG. 12).

As already indicated above, each current line is connected to the positive voltage source (by conductive via 437) so as to be able to transmit a bidirectional current.

When the input vector is 000, the sum of the currents injected in line 132 is $-3 \times I$; the limiter 500 then injects a current $2 \times I$ in via 438 (activation of the PMOS 501 to 503 transistors) to limit the current to $-I$, conserving the sign, at the same time. Similarly, if the vector is 111, the sum of the currents injected is $+3 \times I$; the limiter injects $-2 \times I$ into via 438 (activation of NMOS 504 to 506) to limit the current to $+I$. Therefore, there is always a current equal to $+/-I$ in the branch of current line 132 situated after the 500 limiter. With regard to the architecture of the limiter, other combinations of the input vector have no effect on the current.

The invention is certainly not limited to the method of production that has just been described.

In particular, the invention has been described in the case of a 1-bit or 2-bit adder but it has other applications in generating other types of logic functions.

For example, we are going to present below a device for producing an "and" logic gate in the invention using a magnetoresistive stack with field write-in. An "and" gate with two inputs gives the logic value "1" on output if and only if all its inputs are at "1". This is shown in the truth table in Table 8 below.

TABLE 8

| | A | |
|---|---|---|
| B | 0 | 1 |
| 0 | 0 | 0 |
| 1 | 0 | 1 |

As previously indicated the inputs A and B are current coded such that:

$A = \text{'0'} \Leftrightarrow I_A = -I$ $A = \text{'1'} \Leftrightarrow I_A = I$ $B = \text{'0'} \Leftrightarrow I_B = -I$ $B = \text{'1'} \Leftrightarrow I_B = I$ So, the currents $I_A$ and $I_B$ will be negative where the information is '0' and positive where the information is '1'.

FIGS. 14(a) and (b) show an outline of a device 600 for producing an "and" logic gate respectively with an above view (xy plane) and a side view (along the zy plane).

Device 600 consists of:
- a magnetoresistive stack including a hard ferromagnetic layer and a soft ferromagnetic layer separated by a non-ferromagnetic interlayer (the characteristics of this stack are identical to those described previously with reference to other methods of producing the invention).
- a first current line 601 directed along the y axis and receiving the current $I_A$;
- a second current line 602 directed along the y axis and receiving the current $I_B$;
- a third current line directed along the y axis 603;
- a fourth current line 604.

The absolute value of the current is always the same (equal to 1). The state of the MTJ magnetoresistive stack represents the output of the "and" gate: the parallel state of the magnetoresistive stack represents a "1", and the anti-parallel state a "0". The current arrows show the direction in which the current is counted as positive. With the conventions used, a positive current generates a positive field along the x axis.

The fourth current line 604 is a line directed along the y axis and passing above the MTJ stack at a distance d along the vertical z axis.

In device 600, line 603 is a supplementary line that is required to break up the symmetry of the device as, if there are only lines corresponding to inputs A and B (601 and 602) and the values of the inputs are reversed, the magnetic state will necessarily be opposed. Therefore, there cannot be the same output configuration for the input combinations "01" and "10" as is the case for an "and" gate. By using the supplementary current line 603 for which the current flowing through it is constant, a dissymmetry is produced in the form of a field shift. Line 603 always has a negative current of value −1 flowing through it.

The three current lines 601, 602 and 603 are interconnected to the fourth current line 604 via current line 605 directed along the x axis so as to form three input points $E_1$, $E_2$ et $E_3$ of current in the fourth current line 604 such that the currents flowing in the three current lines 601, 602 and 603 are added together to flow in the fourth current line 604; according to the conventions used here, the current $I_{tot}$ flowing in the fourth current line 604 is such that:

$I_{tot} = I_A + I_B + I.$

The intensity of the magnetic field generated directly depends on the intensity of the current flowing through the line. Consequently, by adding the input currents on the input points $E_1$, $E_2$ et $E_3$ arriving on the fourth current line 604, the intensity value of the magnetic field H generated by the fourth line 604 is modified. The magnetic state of the magnetoresistive stack and therefore the output value according to the input values are given in Table 9 below. The "and" function is produced.

TABLE 9

| A | B | $I_a$ | $I_b$ | I | $I_{tot}$ | H | State | Output |
|---|---|---|---|---|---|---|---|---|
| 0 | 0 | −I | −I | −I | −3I | −3H | AP | 0 |
| 0 | 1 | −I | I | −I | −I | −H | AP | 0 |
| 1 | 0 | I | −I | −I | −I | −H | AP | 0 |
| 1 | 1 | I | I | −I | I | H | P | 1 |

In Table 9 we mention two stable states of the electrical resistance of the MTJ stack: either a parallel state P or an anti-parallel state for the electrical resistance of the MTJ stack. However, it is not necessary to have a stable junction. Choosing an unstable junction may even be advantageous since it will react more easily to the magnetic field, which improves the speed and consumption. It should be recalled that the electrical resistance of the MTJ stack is given as a first approximation (weak bias voltage and ambient temperature) by the equation:

$R_{MTJ} = R_p \cdot (1 + TMR \cdot (1 - \cos \theta)/2)$ where:
- $R_p$ is the nominal resistance of the magnetoresistive stack where the magnetization of both layers of the stack are oriented in the same direction;
- TMR represents the Tunnel Magneto-Resistance, that is, the relative variation in the resistance between extreme states of orientation;
- θ is the angle formed between the orientation for the hard and the soft layers.

So, when θ is equal to 0, the magnetoresistive stack is in a parallel state in which the resistance of the stack in its parallel state $R^p$ attains its minimum and gives $R_{MTJ}^p = R_p$, whilst where θ=π, the magnetoresistive stack is in an anti-parallel state and the electrical resistance of the stack in its anti-parallel state $R_{MTJ}^{ap}$ is maximum and gives $R_{MTJ}^{ap} = R_p \cdot (1 + TMR)$.

In a memory type approach (which is therefore different from the invention), the information is stored in a non-volatile way. It is therefore necessary for the junction to have substantial stability. This stability can be obtained in several way, for example by increasing the shape anisotropy. In a classic memory type use, the stack is therefore oval with a large form factor. The axis of easy magnetization is then directed along the large axis of the junction. In this approach, the field applied so as to shift the magnetization from its equilibrium position sufficiently so that where the field is no longer applied, the magnetization rejoins its second stable position and conserves it (bi-stable function). The information is therefore kept apart from any external solicitation, hence its non-volatile character. In this case therefore, we will talk about the "switching" of the magnetization. In this case, the magnetization of the hard layer is aligned with this axis of easy magnetization so as to switch between the Parallel and Anti-Parallel states to benefit from maximum Tunnel Magneto-Resistance.

In the approach involved in the present invention, the memory effect is not sought; the information must simply be maintained during the calculation, that is, when the field is applied. Here, stability is therefore ensured by the magnetic field applied during the operation. Therefore, it is not necessary to have a stable junction. Choosing an unstable junction will also be advantageous since it reacts more easily to the magnetic field, which improves speed and consumption rate.

To reduce the stability of the junction, the round layers of the stack may be used, or the almost round ones (with a low form factor). The soft layer keeps an easy magnetization axis due to the magnetocrystalline anisotropy. The application of a magnetic field in this case is not going to make the magnetization of the soft layer switch between two stable states, but shift the magnetization from its stable position by an angle θ, that is positive or negative according to the information coded ('0' or '1'). To differentiate this function from the memory function described above, we will use the term "modulation" of the magnetization rather than "switching". In this case, the magnetization of the hard layer must be perpendicular to the easy magnetization axis such that the magnetization of the hard layer approaches the Parallel or Anti-Parallel state.

In this approach, therefore, it is the sign of the angle which represents the binary value '0' or '1'. Irrespective of the initial stable position, the function remains perfectly symmetrical. Choosing the absolute value of θ will allow a choice to be made between speed and consumption: a small θ angle will require a lesser magnetic field, but the signal will be less substantial which will slow down the CMOS read circuit. A greater angle will increase the read speed.

In the invention, it is the interconnection of the write current lines that forms the logic function. Certainly, the interconnection of the write lines and the different distances between the write lines and the magnetoresistive stack may be used to create more complex logic functions as shown in the case of the adders indicated in FIGS. 8 and 12. The sum of the currents and the distances between the lines are determined using the logic function to be performed.

This approach avoids the use of CMOS parts that are intermediary to the components, as it is not broken down into elementary blocks of the "and", "or" or "supplementary" types.

The CMOS parts are only used to produce the input and output interfaces of the function. This allows freedom from the response times inherent in CMOS technology and the full benefit to be derived from the qualities of the magnetic components in terms of speed and consumption rates.

The invention claimed is:

1. A device for performing a "logic function" including a magnetic structure comprising:
at least one first magnetoresistive stack including a first ferromagnetic layer and a second ferromagnetic layer separated by a non-ferromagnetic interlayer,
at least one first current line situated in the vicinity of the first magnetoresistive stack and generating in the vicinity of the first stack a magnetic field when an electric current passes through it,
wherein, for said at least one first magnetoresistive stack, said first line includes at least two current input points such that two currents are added together in said first line, with a sum of both said currents being determined by said logic function, and
wherein said first line is connected to at least one other current line belonging to a metallization level that is different from a metallization level of the first line, with both lines being connected by an interconnection conductive line and a point of connection between said interconnection line and said first line forming one of the two current input points.

2. A device according to claim 1, wherein said at least two current input points are configured to inject respectively a current $I_1$ et $I_2$ into a third line such that the intensity, H', of the field generated by said third line in the vicinity of the second layer is such that $$\frac{H'}{H} = \frac{I_1 + I_2}{I}$$

where H is the intensity of the magnetic field generated by the third current line when it has a current I passing through it.

3. A device according to claim 1, including:
at least one second magnetoresistive stack that may be either combined with said first stack or different from said first stack, with said second stack including a first ferromagnetic layer and a second ferromagnetic layer separated by a non-ferromagnetic interlayer;
at least two current lines respectively belonging to a first and a second metallization level, with each of the two lines generating a magnetic field in the vicinity of said second stack when an electric current passes through them, said two lines being positioned at distances different from said second ferromagnetic layer of the second stack.

4. A device according to claim 3, wherein said two lines are situated on either side of said second magnetoresistive stack.

5. A device according to claim 3, wherein one of said two lines is situated at a distance d1 above said second layer and the other of said two lines is situated at a distance $d_2$ below said second layer such that, for two currents of the same intensity flowing respectively in either of said two lines, the intensities $H_1$ and $H_2$ of the fields generated respectively by the line situated at distance d1 and by the line situated at distance $d_2$ in the vicinity of said second layer are such that:

$$\frac{H_1}{H_2} = \frac{d_2}{d_1}.$$

6. A device according to claim 1, comprising:
at least one magnetoresistive stack including a first ferromagnetic layer and a second ferromagnetic layer separated by a non-ferromagnetic interlayer;
at least two current lines respectively belonging to a first and a second metallization level, with each of said lines generating a magnetic field in the vicinity of said at least one stack when an electric current passes through them, wherein said lines are positioned at an equal distance on either side of said second ferromagnetic layer.

7. A device according to claim 1, wherein the first ferromagnetic layer is a hard ferromagnetic layer pinned in a fixed magnetic state used as a reference and the second ferromagnetic layer is a soft ferromagnetic layer.

8. A device according to claim 7, wherein the soft layer has a circular or quasi-circular form so as to minimize the write-in current necessary to modulate their magnetic orientation.

9. A device according to claim 7, wherein the hard layer of each of the magnetoresistive stacks is pinned in a magnetic state perpendicular to an axis of easy magnetization used as a reference for the soft layer of the same stack, with the soft layer of the magnetoresistive stack having a magnetic orientation that can be modulated by the current coming from the current line or current lines situated in the vicinity of the magnetoresistive stack so as to induce a modification to the transversal resistance of the stack sufficient to set off an electric signal, with such modulation of the magnetic orientation of the layer being sufficiently weak so that the orientation does not switch between two stable positions but fluctuates around one stable position.

10. A device according to claim 1, comprising an input interface including:
   at least one input receiving logic information encoded in the form of a voltage level representing a logical '0' or '1';
   at least one output connected to an interconnection conductor line;
   electronic means for generating a current in said interconnection conductor line having a direction representative of the logic information, an absolute value of the intensity of said current being identical in either direction of said current.

11. A device according to claim 1, comprising an output interface electrically linked to said at least one first magnetoresistive stack, with the interface comprising:
   an input connected to an interconnection conductive line electrically connecting said input to said at least one first magnetoresistive stack;
   means for measuring the current flowing through said at least first stack, with the current being representative of the magnetic state of said at least first stack;
   means for generating a voltage representative of said magnetic state according to said current.

12. A device according to claim 1, comprising:
   a second magnetoresistive stack including a first ferromagnetic layer and a second ferromagnetic layer separated by a non-ferromagnetic interlayer;
   an output interface electrically connected to said first and second magnetoresistive stacks, said interface comprising:
      a first current input connected to an interconnection conductor line electrically connecting said first current input to said first magnetoresistive stack;
      a second current input connected to an interconnection conductor line electrically connecting said second input to said second magnetoresistive stack;
      means for generating a differential current (Aimed) between the current flowing in said first stack and the current flowing in said second stack when subjected to a bias voltage, said differential current being representative of a logic information;
      means for generating a voltage representative of said logic information according to said current differential.

13. A device according to claim 10, wherein said input and/or output interface is performed in CMOS technology.

14. A device according to claim 13, wherein said magnetic structure is situated above said interface or interfaces produced with CMOS technology.

15. A device according to claim 1, wherein the non-ferromagnetic interlayer is made of magnesium oxide (MgO).

16. A device according to claim 1, comprising at least two lines of different widths situated in the vicinity of a magnetoresistive stack.

17. An adder incorporating a device according claim 1, the adder comprising:
   an input interface for signals of current $I_A$, $I_B$ and $I_{Cin}$ flowing through three interconnection lines,
   a magnetic structure comprising:
      a magnetic part for generating a sum,
      a magnetic part for generating a carry,
   with said magnetic part for generating said carry comprising:
      a first magnetoresistive stack including a hard ferromagnetic layer and a soft ferromagnetic layer separated by a non-ferromagnetic interlayer, with the hard ferromagnetic layer being pinned in a fixed magnetic state used as a reference,
      a second magnetoresistive stack including a hard ferromagnetic layer and a soft ferromagnetic layer separated by a non-ferromagnetic interlayer, with the hard ferromagnetic layer being pinned in a fixed magnetic state used as a reference,
      a first current line generating a magnetic field in the vicinity of said first and second stacks and being situated at a distance d along a vertical axis of the soft layer of each of the first and third stacks,
      a first and a second vertical conductive via electrically connecting said first current line respectively to a second current line through which travels the current $I_A$ and to a branch of a third current line through which the sum of the currents $I_B+I_{Cin}$ travel such that the currents $I_B+I_{Cin}$ and $I_A$ are added together before being routed on said first current line generating a magnetic field in the vicinity of said first and second stacks.

18. An adder according to claim 17, wherein the magnetic part for generating said sum comprises:
   a third magnetoresistive stack including a hard ferromagnetic layer and a soft ferromagnetic layer separated by a non-ferromagnetic interlayer, with the hard ferromagnetic layer being pinned in a fixed magnetic state used as a reference,
   a fourth magnetoresistive stack including a hard ferromagnetic layer and a soft ferromagnetic layer separated by a non-ferromagnetic interlayer, with the hard ferromagnetic layer being pinned in a fixed magnetic state used as a reference,
   a third and a fourth current line, said second, third and fourth current lines belonging respectively to a first, a second and a third metallization level,
   a third, a fourth and a fifth vertical conductive via for access to said input interface respectively electrically connected to said second, third and fourth current lines such that said third vertical via injects the current $I_B$ into said third line, said fourth vertical via injects the current $I_A$ into said second line and said fifth vertical via injects the current $I_{Cin}$ into said fourth current line,
   with said second current line generating a magnetic field in the vicinity of the third and fourth stack and being situated at a distance d along the vertical axis of the soft layer of each of said third and fourth stacks,
   with said third current line generating a magnetic field in the vicinity of said third stack and being situated at a distance 2×d along the vertical axis of the soft layer of said third stack,
   with said fourth current line generating a magnetic field in the vicinity of said third and fourth stacks and being situated at a distance 2×d along the vertical axis of the soft layer of each of said third and fourth stacks,
   with said third current line being electrically connected to said fourth current line by a vertical interconnection via such that the currents $I_B$ and $I_{Cin}$ of said third and fourth lines are added together before being routed on the branch of said fourth current line generating a magnetic field in the vicinity of said fourth stack,
   with said second current line being substantially perpendicular to said third and fourth current lines in the vicinity of said third stack and said second current line being substantially perpendicular to said fourth current line in the vicinity of said fourth stack.

19. An adder incorporating a device according to claim 1, the adder comprising:
an input interface for signals of current $I_{A0}$, $I_{B0}$ and $I_{Cin0}$ flowing through three interconnection lines,
a magnetic structure comprising:
a magnetic part for generating said sum comprising:
a first magnetoresistive stack including a hard ferromagnetic layer and a soft ferromagnetic layer separated by a non-ferromagnetic interlayer, with the hard ferromagnetic layer being pinned in a fixed magnetic state used as a reference,
a second magnetoresistive stack including a hard ferromagnetic layer and a soft ferromagnetic layer separated by a non-ferromagnetic interlayer, with the hard ferromagnetic layer being pinned in a fixed magnetic state used as a reference,
a first, a second and a third current line belonging respectively to a first, a second and a third metallization level,
a first, a second and a third vertical conductive via for accessing said input interface respectively electrically connected to said first, second and third current line such that the first vertical via injects the current $I_{B0}$ into said first line, said second vertical via injects the current $I_{A0}$ into said second line and said third vertical via injects the current $I_{Cin0}$ into said third line,
with said second current line generating a magnetic field in the vicinity of said first and second stacks and being situated at a distance d along the vertical axis of the soft layer of each of said first and second stacks,
with said first current line generating a magnetic field in the vicinity of said first stack and being situated at a distance 2×d along the vertical axis of the soft layer of said first stack,
with said third current line generating a magnetic field in the vicinity of said first and second stacks and being situated at a distance 2×d along the vertical axis of the soft layer of each of said first and second stacks,
with said first current line being electrically connected to said third current line through a vertical interconnection via such that the currents $I_{B0}$ and $I_{Cin0}$ of said first and third lines are added together before being routed on branch of said third current line generating a magnetic field in the vicinity of said second stack,
with said second current line being substantially perpendicular to said first and third current lines in the vicinity of said first stack and said second current line being substantially perpendicular to said third current line in the vicinity of said second stack,
a fourth current line belonging to said first metallization level,
a fourth and a fifth vertical conductive via electrically connecting said fourth current line respectively to said second current line through which the current $I_{A0}$ travels and to said branch of said third current line through which travel the currents $I_{B0}+I_{Cin0}$ such that the currents $I_{B0}+I_{Cin0}$ and $I_{A0}$ are added together before being routed on said fourth current line
a fifth current line belonging to a metallization level different from said first metallization level and suitable for producing a magnetic field in the vicinity of a magnetoresistive stack,
a sixth vertical conductive via electrically connecting said fourth current line to said fifth current line.
20. An adder according to claim 19, comprising:
a seventh vertical conductive via connected electrically to the fourth line;
a current limiter circuit to limit the absolute value of the current flowing in said fourth line, with said current limiter circuit being connected to said propagation fourth line by said seventh conductive via.
21. An adder according to claim 20, wherein said limiter circuit includes three transistors PMOS and three NMOS transistors mounted in series, with the first PMOS transistor and the third NMOS transistor having their common gate, the second PMOS transistor and the second NMOS transistor having their common gate, the third PMOS transistor and the first NMOS transistor having their common gate, with the common drain of the first NMOS transistor and of the third PMOS transistor being connected to said fourth line by said seventh vertical conductive via.
22. An "and" logic gate incorporating a device according to claim 1, with said "and" gate including:
an input interface for current signals $I_A$ and $I_B$,
a magnetic structure including:
a magnetoresistive stack including a hard ferromagnetic layer and a soft ferromagnetic layer separated by a non-ferromagnetic interlayer, with the hard ferromagnetic layer being pinned in a fixed magnetic state used as a reference,
a first, a second, a third and a fourth line current,
with said first current line receiving the current $I_A$,
with said second current line receiving the current $I_B$,
with said third current line receiving a constant predetermined current,
with said fourth current line being situated in the vicinity of said magnetoresistive stack and generating in the vicinity of said stack a magnetic field when an electric current passes through it, with said fourth current line comprising three current input points electrically linking it to said first, second and third current lines such that the currents flowing in the first, second and third current lines are added together in said fourth line.
23. A majority voting circuit incorporating a device according to claim 1, said majority voting circuit comprising:
a current signal input interface for current $I_a$, $I_b$ and $I_c$ flowing through three interconnection lines,
a magnetic structure comprising a magnetic part for generating the output of said majority voting circuit including:
a first magnetoresistive stack including a hard ferromagnetic layer and a soft: ferromagnetic layer separated by a non-ferromagnetic interlayer, with the hard ferromagnetic layer being pinned in a fixed magnetic, state used as a reference,
a second magnetoresistive stack including a hard ferromagnetic layer and a soft ferromagnetic layer separated by a non-ferromagnetic interlayer,
with the hard ferromagnetic layer being pinned in a fixed magnetic state used as a reference,
a first current line generating a magnetic field in the vicinity of said first and second stacks and being situated at a distance d along the vertical axis of the soft layer of each of said first and third stacks,
a first and a second vertical conductive via electrically connected to said first current line respectively to a second current line through which the current $I_a$ travels and to a branch of a third current line through which the sum of the currents $I_b+I_c$ travels such that the currents $I_b+I_c$ et $I_a$ are added together before being routed on said first current line generating a magnetic field in the vicinity of said first and second stacks.

* * * * *